United States Patent [19]

Morton

[11] Patent Number: 5,721,704

[45] Date of Patent: Feb. 24, 1998

[54] CONTROL GATE DRIVER CIRCUIT FOR A NON-VOLATILE MEMORY AND MEMORY USING SAME

[75] Inventor: Bruce L. Morton, Austin, Tex.

[73] Assignee: Motorola, Inc., Schaumburgh, Ill.

[21] Appl. No.: 703,174

[22] Filed: Aug. 23, 1996

[51] Int. Cl.⁶ ............................ G11C 11/34; G11C 7/00
[52] U.S. Cl. ...................... 365/185.23; 365/185.26; 365/185.29; 365/185.33; 365/218
[58] Field of Search .................. 365/185.05, 185.18, 365/185.23, 185.26, 185.27, 185.29, 185.33, 218, 226

[56] References Cited

U.S. PATENT DOCUMENTS

| 4,434,478 | 2/1984 | Cook et al. | 365/185.18 |
|---|---|---|---|
| 4,565,932 | 1/1986 | Kuo et al. | 365/226 |
| 4,689,504 | 8/1987 | Raghunathan et al. | 365/226 |
| 4,751,678 | 6/1988 | Raghunathan et al. | 365/185.33 |
| 5,371,705 | 12/1994 | Nakayama et al. | 365/185.23 |
| 5,455,789 | 10/1995 | Nakamura et al. | 365/185.23 |
| 5,471,422 | 11/1995 | Chang et al. | 365/185.26 |
| 5,566,110 | 10/1996 | Soenen et al. | 365/185.05 |
| 5,579,262 | 11/1996 | Song | 365/185.33 |
| 5,587,951 | 12/1996 | Jazayeri et al. | 365/226 |

OTHER PUBLICATIONS

Ser. No.: 08/603,939; Filing Date: Feb. 20, 1996; Inventor: Kuo-Tung Chang et al. "Method for Operating a Memory Array.".

Primary Examiner—David C. Nelms
Assistant Examiner—Trong Phan
Attorney, Agent, or Firm—J. Gustav Larson; Paul J. Polausky

[57] ABSTRACT

A control gate driver circuit (900) provides a variety of voltages to a control gate (21) of a floating gate nonvolatile memory cell (10) using a single circuit. During a read mode, a bias circuit (920) and a reference transistor (925) bias a pass transistor (936) connected to the output of a level shifter (910) to be slightly conductive and thus biases control gates without the need for a charge pump. During programming, a pulse circuit (940) gradually builds the program voltage provided to cells along a selected row, allowing the use of smaller pass transistors (932, 934) and smaller capacitors in the charge pump of the supply (930). Cells in an unselected row are driven to a different voltage, decreasing junction leakage and maintaining high disturb voltage in cells in the unselected row. The control gate driver circuit (900) is implemented using only P-channel pass transistors, eliminating the need for a costly triple-well process.

25 Claims, 14 Drawing Sheets

FIG.3

| OPERATION | VOLTAGE APPLIED (VOLTS) | | | | | | | |
|---|---|---|---|---|---|---|---|---|
| | SELECTED MEMORY CELL | | | | UNSELECTED MEMORY CELL | | | |
| | SOURCE | ISOLATION GATE | CONTROL GATE | DRAIN | SOURCE | ISOLATION GATE | CONTROL GATE | DRAIN |
| PROGRAM | 0 | 0 | -12 | 5 | 0 | 0 | 3.5 | 5 |
| ERASE | 0 | $V_{DD}$ | 15 | 0 | 0 | 0 | 0 | 0 |
| READ | 0 | $V_{DD}$ | 0-2 | 1 | 0 | 0 | 0-2 | 1 |

5,721,704

CONTROL GATE DRIVER CIRCUIT FOR A NON-VOLATILE MEMORY AND MEMORY USING SAME

CROSS REFERENCE TO RELATED, COPENDING APPLICATIONS

This application is related to our commonly assigned copending patent applications entitled:

"Memory Suitable for Operation at Low Power Supply Voltages and Sense Amplifier Therefor" by Bruce Lee Morton, Ser. No. 08/703,176 Attorney Docket Number SC90023A and filed concurrently herewith;

"Non-Linear Charge Pump" by Bruce Lee Morton et al., Ser. No. 08/703,173 Attorney Docket Number SC90051A and filed concurrently herewith;

"Method and Apparatus for Configuring Operating Modes in a Memory" by Matthew R. Nixon, Ser. No. 08/703,175 Attorney Docket Number SC90177A and filed concurrently herewith;

FIELD OF THE INVENTION

Generally, the present invention relates to a non-volatile memory control circuit, and specifically to a non-volatile memory control circuit for providing positive and negative voltages to a control gate of a memory cell.

BACKGROUND OF THE INVENTION

Electrically erasable and programmable read-only memory (EEPROMs) are nonvolatile memory devices which are erased and programmed using electrical signals. An EEPROM device typically includes several thousand memory cells, each of which may be individually programmed and erased. In general, an EEPROM cell includes a floating gate transistor and a select transistor. The select transistors in an EEPROM device are used to select individual EEPROM cells which are to be erased or programmed. The floating gate transistors in the device are those transistors which actually store the digital value of each particular memory cell.

To program and erase a cell, a phenomenon known as Fowler-Nordheim tunneling is commonly used to store either a positive or a negative charge on the floating gate electrode of the floating gate transistor. For example, programming is accomplished by applying a positive voltage to a drain and a gate of the select gate transistor while a control gate of the floating gate transistor is held at ground. As a result, electrons tunnel from the floating gate of the floating gate transistor, through a tunnel dielectric to the drain, leaving the floating gate positively charged.

One particular configuration of EEPROM is a flash EEPROM. Flash EEPROMs provide electrical erasing and programming capability and generally have an increased circuit density. This increased circuit density typically comes at the cost of only being able to block erase a flash EEPROM array. Typically, the array is erased in a single step or a flash, which is why it is termed flash EEPROM.

Because the erase and program states of a cell are determined by applying large voltages to the control gate, it becomes difficult to design a driver circuit which can operate with such a range of voltages. For example, as integrated circuit geometries have decreased, high voltages applied between the gate and source or drain of the transistors in the driving circuit themselves have caused reliability problems. In addition, the need to apply different high voltages becomes difficult to implement with a small amount of circuit area.

Integrated circuit EEPROM devices are conventionally implemented in complimentary metal oxide semiconductor (CMOS) technology. Using CMOS technology, a transistor of a given conductivity type is normally formed in the substrate, if a transistor of the opposite conductivity type is desired, a region known as a well or tub must be formed within the substrate and the transistor is subsequently formed within that well or tub. However, exposure to these extremely high voltages can cause the parasitic diode between the well and the substrate to break down. Exposure to negative voltages will cause parasitic diodes to be forward biased.

For example, if an integrated circuit EPROM were formed in a P-type substrate, a normal N-channel transistor could be formed directly in the substrate, while a P-channel transistor would require an N-type well. However if an N-channel transistor were formed directly in the substrate, exposure to the negative program or erase voltage could cause the parasitic PN diode to be forward biased. Thus the N-channel transistor would need to be placed in a P-well which is further in an N-well. These well structures increase integrated circuit area and are generally undesirable. Thus a need exists to provide a control gate driver circuit which accommodates widely different voltages but does so with a minimum of circuit area.

BRIEF DESCRIPTION OF THE DRAWINGS

FIG. 3 is a table demonstrating one method for operating a memory array according to the present invention.

DETAILED DESCRIPTION OF THE DRAWINGS

In the present invention, a control circuit receives an erase voltage, a positive program voltage, and a negative program supply. The control circuit generates a bias voltage via a bias circuit. During a program cycle to a selected memory cell, the negative program supply is provided to a control gate line. During a program cycle to a non-selected memory cell, the positive program voltage is provided to the control gate line. During an erase cycle to a selected memory cell, the erase voltage is provided to the control gate line. During a read cycle, the bias voltage is provided to the control gate line.

The present invention provides a method for improving band to band leakage and the drain disturb problem of a non-volatile memory array. To address these problems, previously known devices have modified either the layout of the memory array or adjusted the structure or each memory cell in the array. The present invention, however, modifies how a memory array is operated rather than modifying the physical design of the memory array.

Because only the operation of a non-volatile memory array is changed, there is no need to make expensive changes to either the layout of the memory array or design changes to the individual memory cell structure. Since the present invention does not encompass modifications to the memory array, it is not limited to a particular EEPROM cell structure. This allows the programming and reading techniques of the present invention to be used with a variety of nonvolatile memory array configurations.

Figure 1:
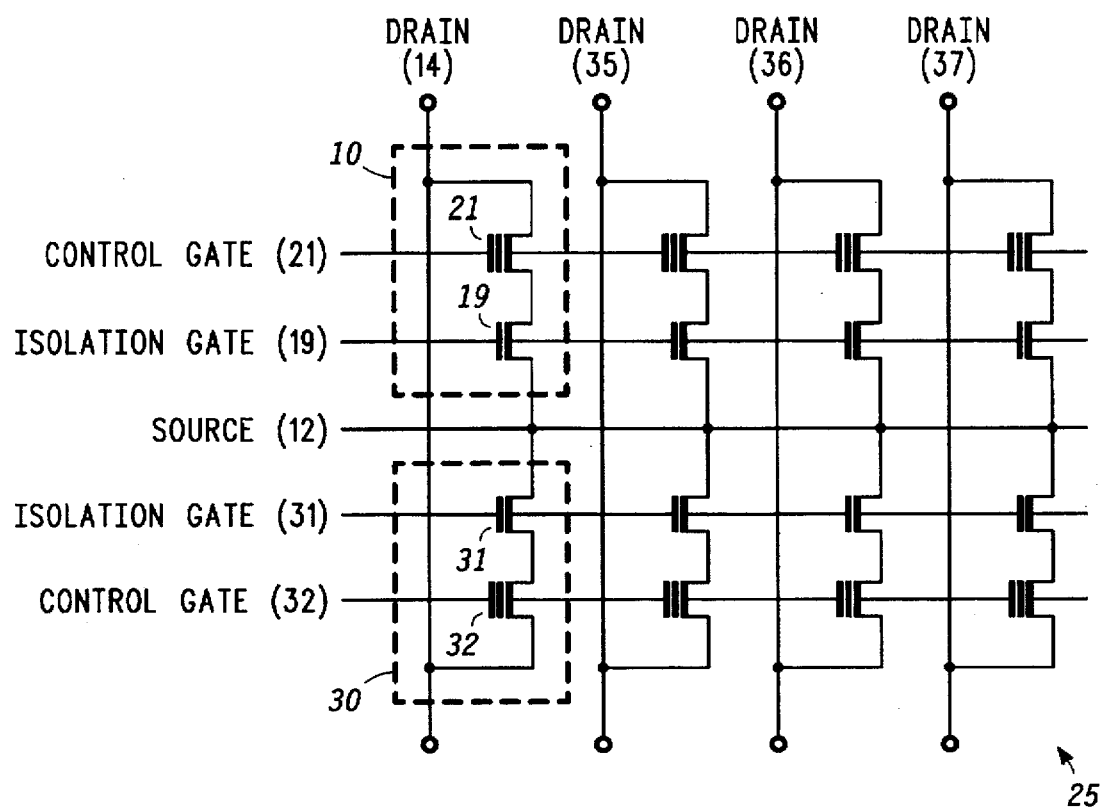
FIG. 1 is a schematic view showing a memory array.

Turning now to FIG. 1, a detailed description of the method of programming a non-volatile memory array according to the present invention will be provided. FIG. 1 shows a memory array 25 that is made up of individual memory cells each having an isolation transistor and a floating gate transistor. It should be understood that FIG. 1 is provided to give a schematic representation of a non-volatile memory array and that the present invention is not limited to this exact configuration or number of memory cells within memory array 25. One of the many features of the present invention is that the following operational techniques are compatible with memory arrays of various sizes and configurations.

In this particular example, memory array 25 is arranged to have two rows of memory cells with each row having four cells. Dashed boxes are used to identify the elements of two particular memory cells within memory array 25. For the purposes of the discussion to follow, memory array 25 comprises a selected memory cell 10 and an unselected memory cell 30. Selected memory cell refers to the memory cell that is being either programmed, erased, or read, and unselected cell 30 refers to a neighboring cell in memory array 25 that is not enabled and is potentially undergoing the affects of the drain disturb phenomenon.

Figure 2:
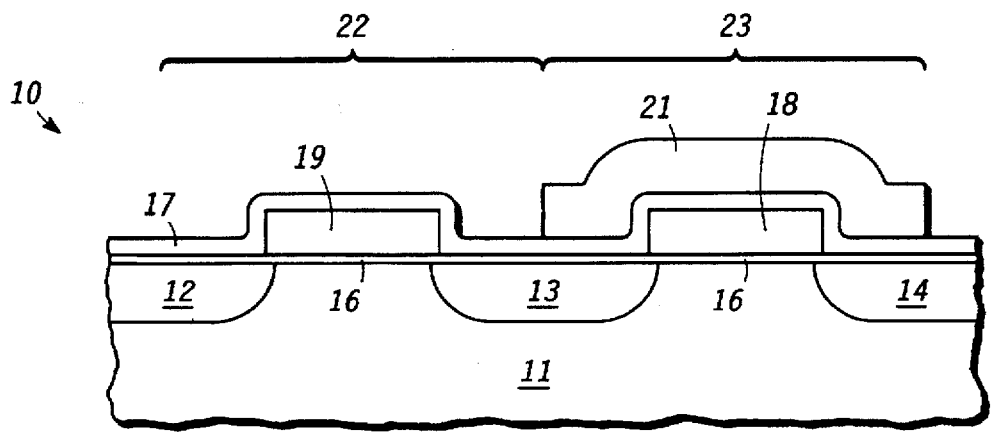
FIG. 2 is a cross-sectional view of a memory cell that can be used in conjunction with the present invention.

Each memory cell in memory array 25 is enabled by a control gate line, an isolation gate line, a source line, and a drain line. All of these signal lines provide the necessary voltage potentials to the appropriate portions of each memory cell during operation of memory array 25. As mentioned earlier, the embodiments of the present invention are not restricted to a certain memory cell configuration. However, for the purpose of clarity a particular memory cell structure will be provided as an example of a memory cell that can be used in memory array 25. FIG. 2 is an enlarged cross-sectional view of a memory cell 10 that can be used to implement each memory cell location.

As shown in FIG. 2, memory cell 10 comprises two transistors, an isolation transistor 22 and a floating gate transistor 23. Both the structure and manufacture of memory cell 10 are described in U.S. Pat. No. 5,471,422, which issued to Chang et al. on Nov. 28, 1995 and is hereby incorporated by reference. Isolation transistor 22 has a gate terminal 19 which is used to modulate a channel between source terminal 12 and drain terminal 13. Floating gate transistor 23 has a gate terminal 21 that is electrically isolated from floating gate structure 18 by a dielectric material 17, and gate terminal 21 is used as a control gate to modulate a channel between source terminal 13 and drain terminal 14. Note that drain terminal 13 of isolation transistor 22 also acts as the source terminal 13 of floating gate transistor 23. Both transistors 22 and 23 are formed on a common dielectric layer 16 which provides electrical isolation between substrate 11 and gate terminal 19 and floating gate structure 18.

Previously known non-volatile memory arrays typically comprise memory cells that are made of a single floating gate transistor that stores the logic state of each memory cell. Such memory arrays are generally configured such that a drain voltage for all transistors in a particular column are shared and so that a gate voltage is shared by all transistor in a common row. To program an individual memory cell, a negative voltage is applied to the gate terminal, the source line is grounded, and a positive voltage is applied to the drain line. In an array configuration, only selected floating gate transistors will have both the negative voltage on the gate and the positive voltage on the drain creating a large voltage differential to promote programming. It is well known, however, that other floating gate transistors that are in the same column as a memory cell that is being programmed will also have the positive voltage on their drains as well. These unselected memory cells, however, do not have the negative voltage applied to their gate terminals. Therefore, they do not have as large of a voltage differential as the memory cell that is being programmed, but still will have a voltage differential large enough to induce the drain disturb problem.

The programming technique of the present invention addresses this shortcoming of previously known memory arrays by reducing the voltage differential present at all unselected memory cells. Referring back to FIG. 1 for the following example, selected memory cell 10 will be programmed while unselected memory cell 30 is left undisturbed. Note that most of the signal lines are intentionally identified with the same element number of structures used in FIG. 2 since they are used to provide voltage potentials to these structures. To program selected memory cell 10 according to the present invention, a negative voltage, about −5 volts to −15 volts, is applied to gate terminal 21 with control gate line 21. A drain line 14 is used to apply a positive voltage, about 0.1 volts to 10 volts, to drain terminal 14 of floating gate transistor 23. An isolation gate line 19 is typically grounded, 0 volts, or has a low enough voltage to turn off isolation transistor 22. A source line 12, which is shared by both selected memory cell 10 and unselected memory cell 30, has a voltage potential of about −5 volts to 5 volts.

Now, the present invention differs from the previous art by applying different voltages to the terminals of unselected memory cell 30 as selected memory cell 10 is being programmed and verified. Instead of grounding the gate terminal of unselected transistors, a voltage of about 0.1 volts to 10 volts is applied to an unselected memory cell 30 using a control gate line 32. Since the voltage potential at gate terminal 32 is about 0.1 volts to 20 volts higher than at gate terminal 21, the drain disturb problem at unselected memory cell 30 is much improved. Since a positive voltage is applied to the gate terminal of unselected gates, as opposed to being grounded like in the prior art, the vertical field along the drain terminal of unselected gates is significantly reduced.

It should also be pointed out that the programming technique of the present invention cannot be used with the previously known memory arrays that have a single floating gate transistor for each memory cell. Because these previously known memory cells do not have an isolation transistor, the single floating gate transistor is exposed to all the voltages present in the memory array. If a positive voltage were to be applied to the gate terminal of unselected memory cells, the voltage would induce a channel between the source and drain of all floating gate transistors. This current flow would not only consume a tremendous amount of power, but would cause the unselected transistors to become programmed due to hot carrier injection (HCI).

The programming technique of the present invention not only protects the unselected memory cells from the drain disturb problem, but it also reduces the amount of current flowing from charge pumps. By reducing the vertical electric field at the drain terminal of all the unselected memory cells, the amount of current passing from the substrate to the drain terminal is significantly reduced. This in turn reduces the amount of current that is required to be provided by charge pumps during a programming sequence. Therefore, the present invention allows non-volatile memory arrays to be designed using small charge pumps which reduces the final manufacturing cost of the memory array.

The present invention also provides for an improved technique to read memory array 25 once selected memory cell 10 is programmed. To read the value stored in selected memory cell 10, about 0.1 volts to 5 volts is placed on drain line 14 and control gate line 21. The power supply voltage, Vdd, is placed on isolation gate line 19, and source line 12 is grounded. Once the voltages are set, the current passing through floating gate transistor 23 is measured to determine the state of memory cell 10.

Previously known reading techniques commonly ground the gate terminal of the unselected memory locations during a read operation. Even at a ground potential there will be some finite amount of leakage current passing through each memory cell. In large array configurations, this parasitic leakage will increase the power consumption of the read operation. The present invention, however, places a known voltage level on the gate terminal of the isolation transistor of unselected memory cells to insure that these memory cells do not conduct. For example, isolation gate line 31 is grounded to prevent unselected memory cell 30 from conducting. This not only reduces the amount of current needed by the charge pumps, but reduces the power consumption of memory array 25. This feature of the present invention allows the control gate of the unselected memory locations to be at any voltage potential. The unselected memory locations will not contribute to leakage current since they are electrically isolated by the isolation transistor.

FIG. 3 is provided to demonstrate a particular set of conditions for both the selected and unselected memory cells during a program, erase, and read operation. Note that this particular example falls within the ranges provided by the present invention and in no way should FIG. 3 be considered limiting when determining the bounds of the applicants invention.

Figure 4:
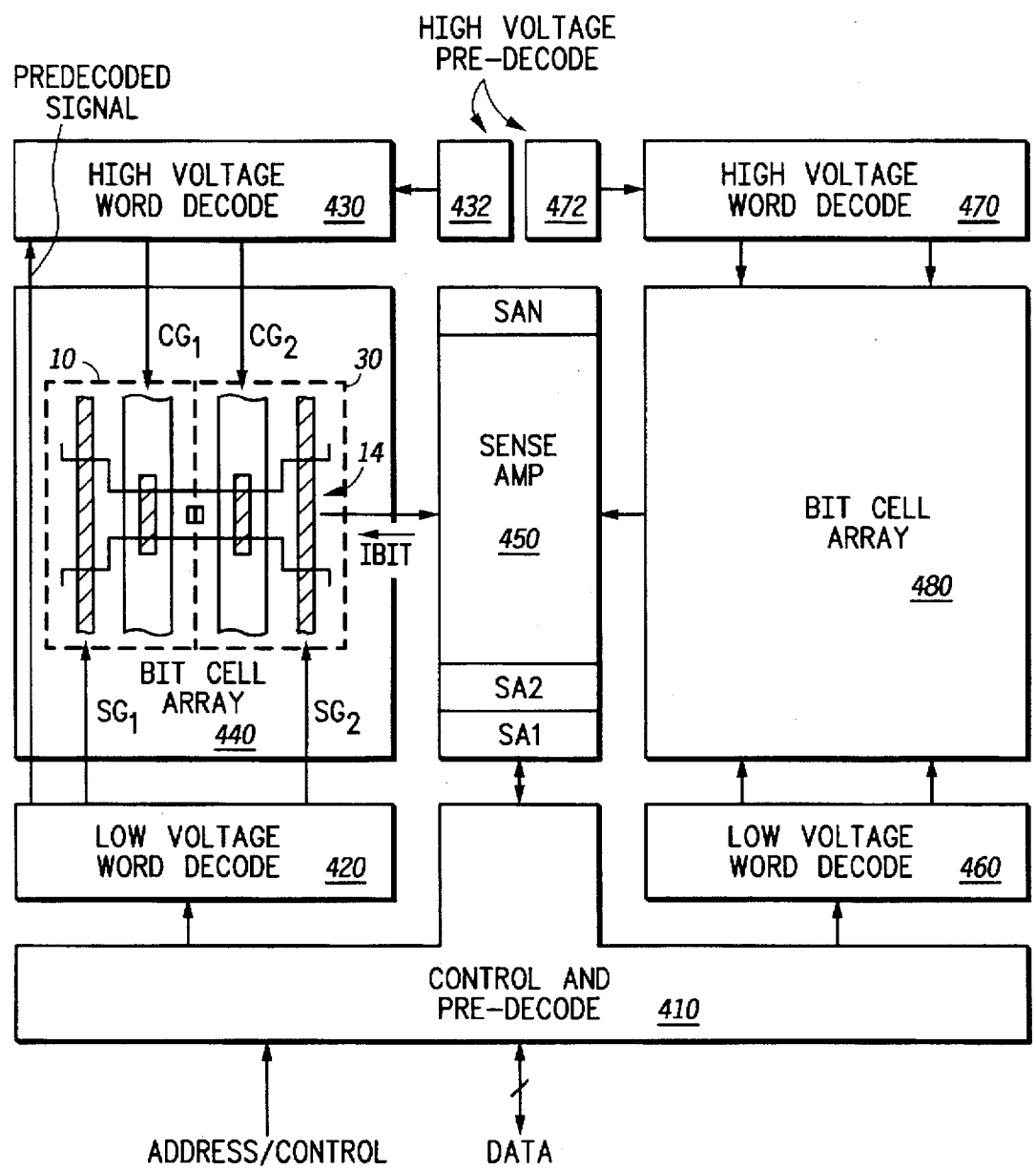
FIG. 4 illustrates, in partial block diagram and partial plan view form, a memory module according to the present invention.

FIG. 4 illustrates, in partial block diagram and partial plan view form, a memory module 400 according to the present invention. Memory module 400 includes generally a control and pre-decode portion 410, a low voltage word decode portions 420 and 460, high voltage word decode portions 430 and 470, high voltage pre-decode portions 432 and 472, bit cell arrays 440 and 480, and sense amplifier (amp) portion 450. Control and pre-decode portion 410 has an input for receiving address and control information labelled "ADDRESS/CONTROL", a bidirectional terminal for conducting signals labelled "DATA", and outputs connected to low voltage word decode portions 420 and 460, high voltage pre-decode portions 432 and 472, and sense amp portion 450. Low voltage word decode portions 420 and 460 have outputs connected to bit cell array 440 and bit cell array 480, respectively, for providing signals to select gates of transistors in bit cell arrays 440 and 480. High voltage pre-decode portions 432 and 472 have outputs connected to high voltage word decode portion 430 and high voltage word decode portion 470, respectively. High voltage word decode portion 430 and high voltage word decode portion 470 are connected to bit cell arrays 440 and 480.

Memory module 400 is a flash EEPROM memory array having a left half bit cell array 440 and a right half bit cell array 480. Each bit cell array includes memory cells located at intersections of rows, each represented by both a control gate line and select gate line, and columns, represented by bit lines. The bit lines are connected to corresponding inputs of sense amp portion 450, which selects eight columns. During the read mode, sense amp portion 450 senses signals from eight selected bit lines and provides the sensed signals to control and predecode portion 410, which outputs DATA in response. During a program mode, DATA is input through control and pre-decode portion 410 into sense amp portion 450 and driven onto the eight selected bit lines for programming into the corresponding memory cells. Illustrated in FIG. 4 are two representative memory cells 10 and 30 which are identical to the memory cells of FIG. 1 and thus are assigned the same reference numbers. Note that the terms "select gate" and "isolation gate" are used interchangeably in this discussion. Drain terminal 14 and the drain terminals of other memory cells located in the same column are connected to a bit line which is connected to sense amp portion 450. Associated with a read cycle is a bit cell current labelled "IBIT" which conventionally is labelled in a direction flowing into the selected memory cell, and which will be useful in understanding the operation of the read cycle more fully below.

In the illustrated embodiment, memory module 400 is a module adapted for connection to a microcontroller core as part of a microcontroller (not shown). However, it should be apparent that memory module 400 may be adapted to be a single chip flash memory as well. Control and pre-decode block 410 is adapted to connect to an internal bus of the microcontroller including having an input for receiving address and control signals therefrom and a bi-directional connection to a data portion of the microcontroller's internal bus. Note that DATA may include any arbitrary number of signals depending on the organization of memory module 400, but in the illustrated embodiment includes eight data signals.

Control and pre-decode block 410 performs several functions. Control and pre-decode 410 includes various registers for enabling different operations of memory module 400. Such operations include, but are not limited to, charge pump enable, write enable, and erase enable. In addition, control and pre-decode block 410 includes logic for receiving the ADDRESS/CONTROL and performing a portion of the decoding/unction required to fully decode the address. Control and pre-decode block 410 also includes switching functions for routing various power signals including voltages associated with charge pump 1120 illustrated in FIG. 11 below. In response to a read or program cycle, control and pre-decode block 410 provides pre-decoded addresses to low voltage word decode blocks 420 and 460 for further decoding. Additional decoding is further performed so that fully decoded select gate drive signals may be output therefrom.

In addition, low voltage word decode blocks 420 and 460 provide predecoded signals across bit cell arrays 440 and 480 to high voltage word decode blocks 430 and 470. For example, FIG. 4 illustrates an exemplary signal labelled "PREDECODED SIGNAL" which low voltage word decode portion 420 provides to high voltage word decode portion 430 across bit cell array 440. By splitting the low and high voltage decoders between two ends of the array and transmitting the predecoded signals on signal lines which fit within the available pitch of the memory cells within the array, memory 400 reduces the circuit area required for decoding.

High voltage pre-decode blocks 432 and 472 provide high voltage signals for use in high voltage word decode blocks 430 and 470 respectively. Each of high voltage pre-decode blocks 432 and 472 receive three input power supply voltages including +5 volts, +15 volts, and −12 volts, and in addition receive a portion of the address and various control signals. High voltage pre-decode blocks 432 and 472 provide high voltage pre-decoded address signals to high voltage word decode blocks 430 and 470, respectively, in response. High voltage word decode blocks 430 and 470 receive predecoded signals from both low voltage word decode blocks 420 and 460 and high voltage pre-decode blocks 432 and 472, and in turn drive the transistor control gates in a selected row. The control gates are driven to appropriate voltages as discussed with reference to FIG. 3 above.

Each of bit cell array 440 and 480 includes individual bit cells located at unique intersections of word lines and bit lines within each half of memory module 400. For example, bit cell arrays 440 and 480 are each organized in 256 word lines by 512 bit lines. Note that for each word line, a unique control and select gate signal are used. Each of the 512 bit lines provide a bit line signal to sense amplifier portion 450. Shown within bit cell array 440 is a representative pair of bit cells which correspond to memory cells 10 and 30 of FIG. 1, and are therefore designated by the same reference numbers.

Sense amplifier portion 450 includes 64 sense amplifiers and has a bidirectional connection to control and pre-decode portion 410. Each of the 64 sense amplifiers is connected to eight bit lines and, based on decode information from pre-decode portion 410, performs an eight-to-one multiplex function during a read mode. Note that during a program mode or erase mode a one-to-eight de-multiplex function occurs. Eight multiplexed outputs from the 64 sense amplifiers are further selected to provide an eight-bit output. According to one aspect of the present invention, a portion of the sense amplifiers are further used to store data during a program cycle, saving integrated circuit area, as will be more fully described with reference to FIG. 8 below.

During a read cycle, control and pre-decode block 410 receives an input address and control signals designating the read cycle. During the cycle, control and pre-decode block 410 determines whether a byte of memory cells are to be selected in the left or right half arrays so that only array 440 or array 480 is active. During the read cycle, the control gates of all memory cells are held to a constant voltage level. In the illustrated embodiment this constant level is equal to a power supply voltage labelled "$V_{SS}$" plus a P-channel threshold designated "$V_{TP}$" plus a small additional voltage equal to approximately 200 millivolts. $V_{SS}$ is a more-negative or ground power supply voltage terminal which has a nominal value of approximately zero volts. For unselected memory cells, the isolation gate remains at 0 volts, while for selected memory cells, the isolation gate is driven to the value f a power supply voltage terminal labelled "$V_{DD}$". $V_{DD}$ is a more positive power supply voltage terminal having a nominal value of 2.7 volts but whose actual value, according to the present invention, may be lowered to approximately 1.8 volts. These voltages select one word line of the bit cell array. For example, if the word line on which memory cell 10 resides were to be selected, select gate 1 "SG1" would be driven to a voltage of $V_{DD}$ and control gate 1 "CG1" would be held to the constant level. As a result, the conductance of memory cell 10 will act to discharge bit line 14. However, while the control gate CG2 of memory cell 30 is kept at the constant (DC) level, its isolation gate will be driven to approximately 0 volts.

During a program cycle, also known as a write cycle, control and pre-decode block 410 receives the address and control signals indicating that a write cycle is in progress and provides decoded address signals as in the read cycle. However, during the write cycle the flow of data is reversed. The sense amplifiers in sense amplifier portion 450 serve an additional function by latching input data and driving the input data onto the selected bit lines. During the write cycle, the memory cells on the selected word line have their isolation gates driven to 0 volts and their control gates driven to −12 volts by high voltage word decode block 430 or 470 as appropriate. However, memory cells on unselected word lines have their isolation gates driven to 0 volts and their control gates driven to 3.5 volts. Note that the voltage of 3.5 volts is obtained by reducing the 5 volt charge pump voltage by an amount equal to an N-channel transistor threshold "$V_{TN}$" of an appropriately sized N-channel transistor. During the read cycle, the isolation gate voltage determine whether memory cell 10 is in an active word line, whereas in program mode, the control gate voltage determines whether cell 10 is in the active word line.

During an erase cycle, either a selected word line, a selected block of word lines, or an entire bit cell array, may be erased. Note that the choice of options for erasure will vary from embodiment to embodiment. During the erase cycle, the voltage driven on the control gate determines whether memory cells in a selected word line will be erased. The memory cells in the selected word line have their control gates driven to 15 volts by high voltage word decode block 430 or 470 for a sufficient amount of time. Note that the 15 volts applied to the control gate of the memory cells on the selected word line must be maintained for approximately 50 milliseconds. In memory module 400, which is adapted for use with a microcontroller core, the 50 milliseconds is determined by the microcontroller core, which must ensure that memory module 400 is not accessed until such time has elapsed. However, if memory module 400 were implemented as a stand alone memory, it would be preferable to include an on-chip timer for measuring the elapsed time during erase mode. During erase mode, the isolation gate of the selected word line is driven to a voltage of $V_{DD}$. Also during erase mode, all bit lines are held at a voltage of zero volts. Holding the isolation gate to a value of $V_{DD}$ allows tunneling to take place more uniformly across the channel and can improve reliability.

Figure 5:
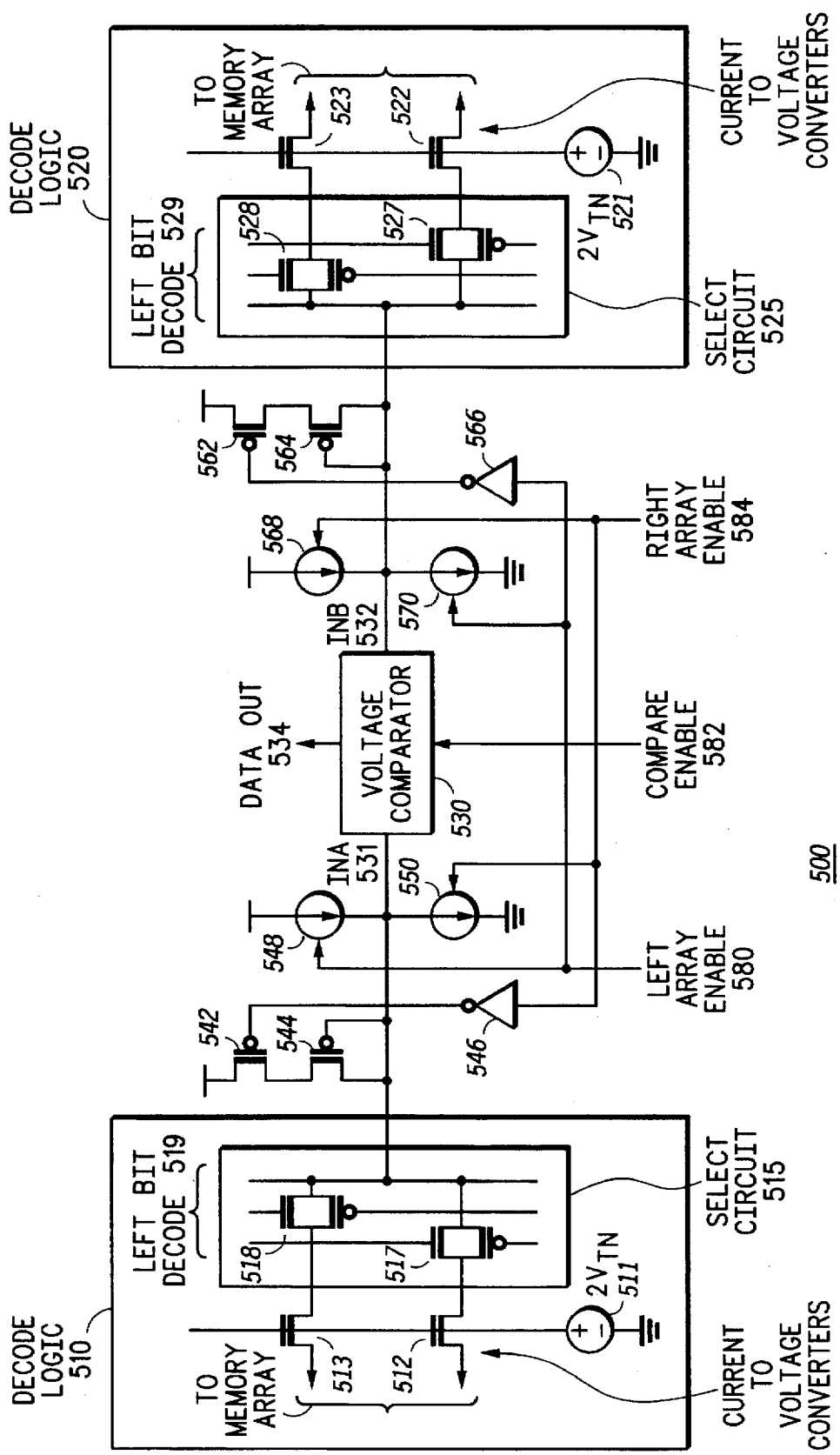
FIG. 5 illustrates in partial block diagram, partial logic diagram, and partial schematic form a decode and sense amplifier portion associated with a read of the memory module of FIG. 4.

FIG. 5 illustrates in partial block diagram, partial logic diagram, and partial schematic form, a decode and sense amplifier portion (sense amp) 500 of memory module 400 of FIG. 4. Sense amp 500 is representative of any of sense amps SA1 through SAN illustrated in FIG. 4. Sense amp 500 includes decode logic portions 510 and 520, P-type MOS transistors 542, 544, 562, 564, inverters 546 and 566, current sources 548, 550, 568 and 570, and voltage comparator 530. Decode logic portion 510 has a plurality of N-type MOS transistors including transitions 512 and 513, a select circuit 515, and a threshold voltage generator 511. Transistor 512 has a gate, a first current electrode for receiving one of a plurality of bit lines from bit cell array 440, and a second current electrode. Transistor 513 has a gate, a first current electrode for receiving one of a plurality of bit lines from bit cell array 440, and a second current electrode. Select circuit 515 has a plurality of transmission gates including transmission gates 518 and 517. Transmission gate 518 has a positive and negative control electrode connected to the control and decode portion 410, a first current electrode connected to the second current electrode of transistor 513, and a second current electrode connected to a node 531 labelled "INA". Transmission gate 517 has a positive and negative control electrode connected to the control and decode portion 410, a first current electrode connected to the second current electrode of transistor 512, and a second current electrode connected to a node INA 531.

Decode logic 520 has a plurality of N-type MOS transistors including transistors 522 and 523, a select circuit 525, and a threshold voltage generator 521. Transistor 522 has a gate, a first current electrode for receiving one of a plurality of bit lines from bit cell array 480, and a second current electrode. Transistor 523 has a gate, a first current electrode for receiving one of a plurality of bit lines from bit cell array 480, and a second current electrode. Select circuit 525 has a plurality of transmission gates including transmission gates 528 and 527. Transmission gate 528 has a positive and negative control electrode connected to the control and decode portion 410, a first current electrode connected to the second current electrode of transistor 523, and a second current electrode connected to a node 532 labelled "INB". Transmission gate 527 has a positive and negative control electrode connected to the control and decode portion 410, a first current electrode connected to the second current electrode of transistor 522, and a second current electrode connected to node INB.

Transistor 542 has a gate, a source connected to $V_{DD}$, and a drain. Transistor 544 has a gate connected to node INA 531, a source connected to the drain of transistor 542, and a drain connected to node INA. Inverter 546 has an input terminal for receiving a signal labeled "RIGHT ARRAY ENABLE" 584, and an output terminal connected to the gate of transistor 542. Current source 548 has an enable input terminal for receiving signal LEFT ARRAY ENABLE 580, a first current terminal connected to $V_{DD}$, and a second current terminal connected to node INA 531. Current source 550 has an enable input terminal for receiving signal RIGHT ARRAY ENABLE 584, a first current terminal connected to node INA 531, and a second current terminal connected to $V_{SS}$.

P-type MOS transistor 562 has a gate, a source connected to $V_{DD}$, and a drain. P-type transistor 564 has a gate connected to the node INA, a source connected to the drain of transistor 562, and a drain connected to the terminal INA.

The inverter 566 has an input terminal for receiving LEFT ARRAY ENABLE 584, and a second output connected to the gate of transistor 562. Current source 568 has an enable signal for receiving a signal labeled "RIGHT ARRAY ENABLE 580", a first current terminal connected to $V_{DD}$, and a second current terminal connected to the node INB. Current source 570 has an enable terminal for receiving a signal labeled "LEFT ARRAY 584", a first current terminal connected to ground, and a second current terminal connected to the node INA. Voltage comparator 530 has a control input terminal for receiving a signal labeled "COMPARE ENABLE 582", a first input terminal connected to node INA, a second input terminal connected to node INB, and an output terminal for providing a signal labeled "DATA OUT 534".

Sense amp 500 represents a portion of one sense amplifier of the sense amplifiers 450. The elements illustrated in sense amplifier 500 are those portions of the sense amplifier related to a read mode.

In operation, during the beginning of a read cycle, the voltage levels at nodes 531 and 532, on either side of voltage comparator 530, are equalized to $V_{DD}$ by circuitry not shown in FIG. 5. Sense amp 500, by creating different discharge rates between node INA 531 and node INB 532, is able to sense at voltage comparator 530 the appropriate stored data state in a bit cell and drive signal DATA OUT 534 in response.

If node INA 531 has been selected to receive information from a bit cell array 440, and a non-conductive bit cell of array 440 has been selected, there would be no discharge rate on the node INA 531. As a result, node INA 531 would maintain its precharge level of $V_{DD}$. However, node INB 532, which has not been selected to receive information from bit cell array 480, would be allowed to discharge at a pre-determined rate, therefore, allowing the voltage comparator to detect a lower voltage on node INB 532 than on node INA 531. Based on the compare, voltage comparator 530 provides signal DATA OUT 534 as a logic level high or a logic level low signal as specified by the system.

If node INA 531 has been selected to receive information from bit cell array 440, and a conductive bit cell of array 440 has been selected, a discharge rate would occur on node INA 531. Sense amp 500 is designed such that the discharge rate at node INA 531 is greater than the discharge rate on node INB 532. This difference in discharge rates allows the voltage comparator 530 to detect a lower voltage on node INA 531 than on node INB 532. As a result, voltage comparator 530 will detect a state complementary to that read when a non-conductive bit cell is read.

The discharge rate of node INB 532, which acts as a reference when data is being read from bit cell array 440, is controlled to a substantially fixed rate by current source 570 which is enabled when LEFT ARRAY ENABLE 580 is asserted to indicate the beginning of a read cycle. Also an activation of signal LEFT ARRAY ENABLE 580 enables current source 548, which when selected provides current to charge node INA 531 at a given rate. The rate at which current source 548 provides charge to node INA 531 is such that when a non-conductive bit cell is selected in array 440, node INA 531 maintains a precharged voltage of $V_{DD}$. In addition, the rate at which current source 548 provides charge to node INA 531 is different in magnitude than the discharge rate of current source 570 such that when a conductive bit is being sensed then the discharge rate on node INA 531 is greater than the discharge rate on node INB 532. Therefore, the charge rate of current source 548 is much smaller than the discharge rate of current source 570.

The relationship of current sources 548 and 570 allow for voltage comparator 530 to appropriately sense the conductive state of a bit cell when node INB 532 and/or node INA 531 are discharging. This relationship is useful when operating at a high frequency of operation, in that the discharge occurs over a relatively short period of time. Sense amp 500 would not be able to read a conductive bit cell if over time the nodes 531 and 532 were allowed to discharge fully zero volts, thereby preventing voltage comparator 530 from reading accurate data. In order to solve this problem, sense amp 500 includes a clamping circuit formed by diode-connected F-channel transistor 564 and enabling P-channel transistor 562. Transistors 562 and 564 clamp node INB 532 to a predefined voltage, and therefore, prevent current source 570 from discharging node 532 completely. As a result, in a slow system, where nodes 531 and 532 finish discharging, node INB 532 will maintain a higher voltage level that node INA 531, where the voltage difference is capable of being sensed by voltage comparator 530. Conversely, when a non-conductive bit is being read, node INB 532 will be at a lower voltage than node INA 531.

In order to sense the data in the manner discussed above, it is necessary to convert current sensed from a bit cell in array 440 into a voltage at node INA 531. Sense amp 500 achieves this sensing function in a way which allows operation at very low power supply voltages by separating the current-to-voltage conversion function from the loading function and distributing them on different sides of select circuit 515. Sense amp 500 allows for low voltage operations by assuring that the amount of voltage drop sensed at voltage comparator 530 is optimized, as opposed to the prior art which had less current to generate the voltage drop.

The voltage conversion relationship among these components begins when transmission gate 517 is selected. Note transmission gate 517 is one of eight transmission lines in the Left Bit Decode block 519 which is controlled by decode logic to select one of 8 bit gates from the bit cell array 440. Once selected, the sensed current from the selected bit line is allowed to flow through N-channel transistor 512 which is biased to a level two N-channel thresholds above $V_{SS}$ by voltage reference 511. This allows the N-channel transistor 512 to operate in a manner similar to that of a common gate amplifier which has a low input impedance and a relatively high output impedance. The low input impedance characteristic of transistor 512 allows the bit line side of transistor 512 to pre-charge quickly at the onset of the read cycle, while the high impedance output characteristic in combination with the very high impedance characteristics of current source 548, allow for a high voltage gain across the transistor 512 onto node INA 531.

As a result of the distribution of the sense amplifier function, transistor 512 in the present embodiment presents a lower impedance to the bit line than would be presented by the prior art. The advantage of positioning the current-to-voltage converter in this way is that there is less voltage drop across transmission gate 517, requiring less bit line charge time, or smaller pre-charging transistors. A further advantage of the present invention over the prior art, is the fact that node INA 531 is charged to $V_{DD}$ prior to the onset of a read cycle. As result, when transmission gate 517 is selected, the P-channel gate-to-source voltage of the transmission gate 517 is the full power supply $V_{DD}$. This allows the P-channel portion of voltage transmission gate 517 to be fully conductive. In the prior art, the gate-to-source is limited to $V_{DD}$ minus the bit line operating level which provides a gate drive which is very near the threshold of the device. As a result, the prior art transmission gate operates near cutoff. The present invention it is assured that during a slow operating memory cycle that node 531 is allowed to discharge fully to ground. Without the N-channel portion of gate 517, this would not be allowed to happen.

While the previous discussions focused on a read from memory array portion 440, when data is being read from memory array portion 480, the circuit operates in a similar and mirrored fashion.

Figure 6:
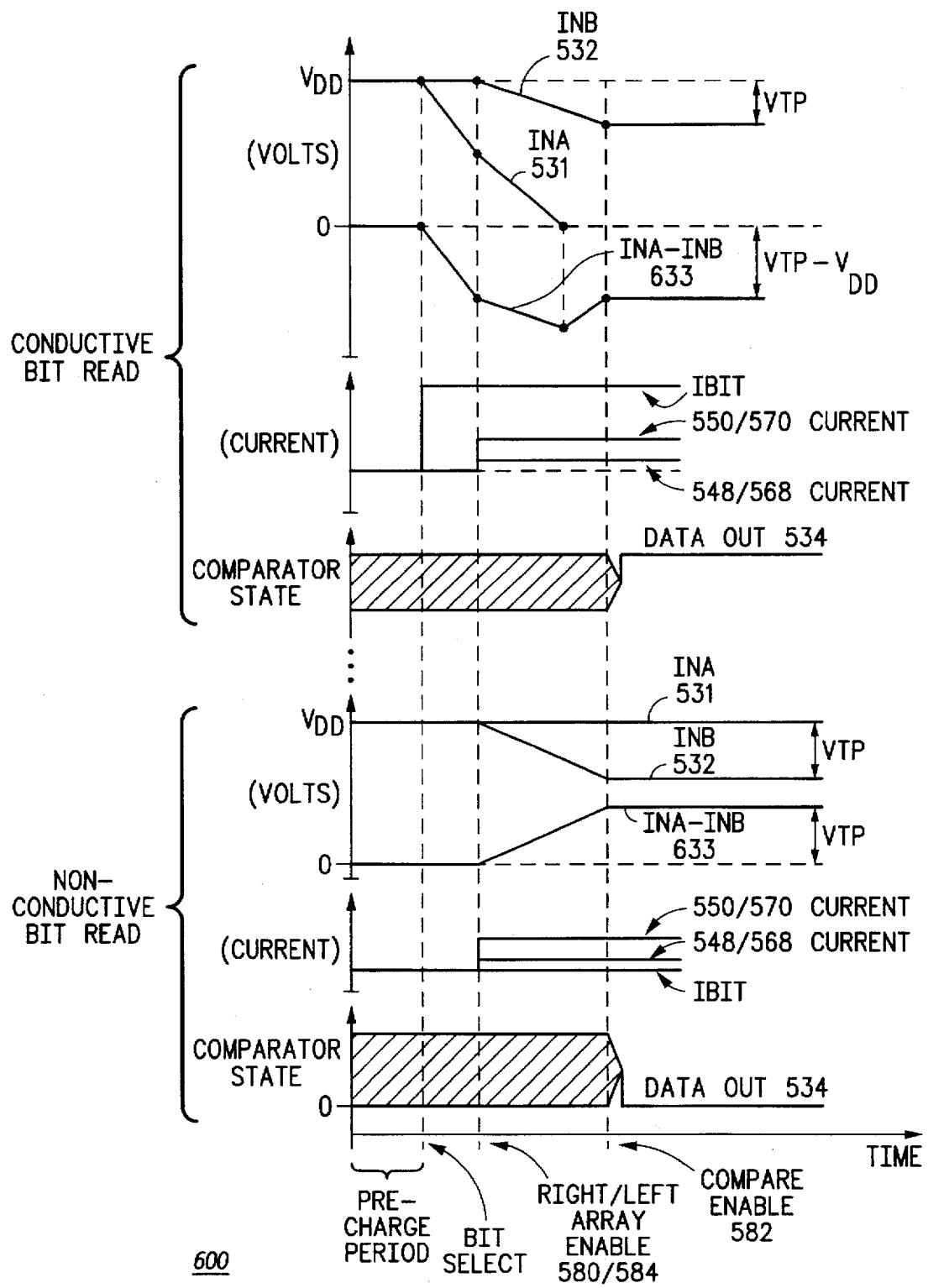
FIG. 6 illustrates a timing diagram of various signals associated with a read cycle of both a conductive and a non-conductive memory cell.

FIG. 6 illustrates a timing diagram of various signals associated with a read cycle of both a conductive and a non-conductive memory cell, which is useful in understanding the operation of sense amp 500 of FIG. 5. The horizontal axis represents time for each graph portion. A conductive bit read and a non-conductive bit read are each represented by 3 graph portions. A first graph portion represents voltage on the vertical access, a second graph portion represents current, while a third graph portion represents a comparator output state.

FIG. 6 illustrates the signal relationships discussed with reference to FIG. 5 for a conductive bit read and a non-conductive bit read. Note that while the relative values of the signals illustrated in FIG. 6 are useful in understanding the operation of memory module 400, they are not necessarily drawn to scale. When data is being read at node INA 531, during a conductive bit read as previously discussed, the voltage level at node INB 532 will discharge at a different rate than the signal at node INA 531 and will not discharge completely to ground. As a result, voltage comparator 530 can read the state of the selected memory cell by sensing the voltage difference between node INA 531 and node INB 532, which is distorted only by the internal voltage offset of the comparator 530.

Likewise, the graph 600 illustrates a representation of a memory cell current associated with a bit cell of array 440, referred to as "BIT" 612; a representation of the current through the current sources 548 and 568, referred to as "S1" 614; and a representation of the current through the current sources 550 and 570, referred to as "S1" 614. Likewise, graphical information for a non-conductive bit read is also provided in graph 600.

Figure 7:
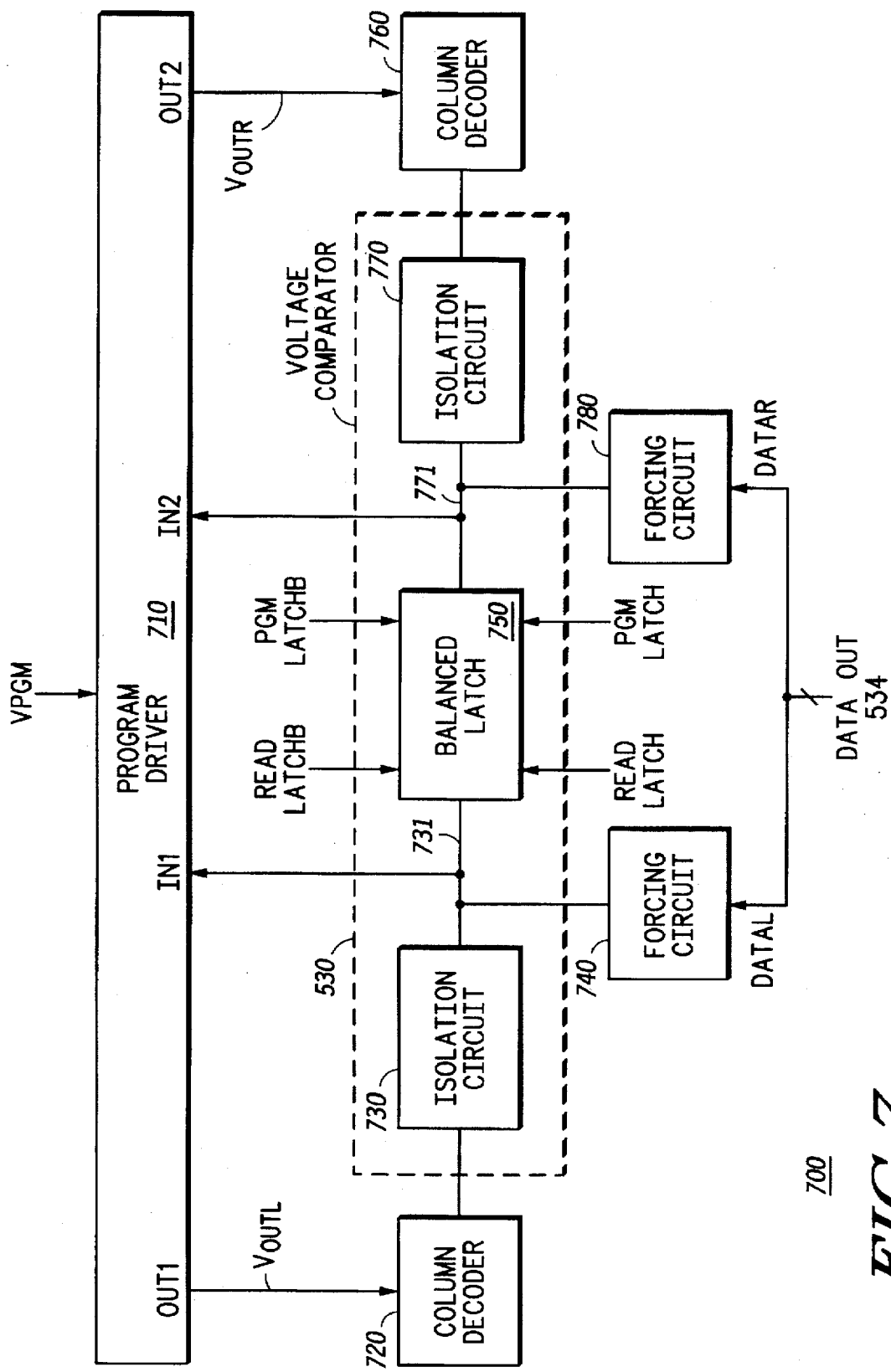
FIG. 7 illustrates, in block diagram form, a programming driver for use in the memory module of FIG. 4.

FIG. 7 illustrates, in block diagram form, a programming driver 700 for use in memory module 400 of FIG. 4. Programming driver 700 forms a portion of sense amp 500 of FIG. 5, and includes both elements common to the read cycle and elements unique to the write cycle. Programming driver 700 includes a portion of voltage comparator 530 of PIG. 5, a program driver 710, decoders 720 and 760, and forcing circuits 740 and 780. The portion of voltage comparator 530 relevant to programming driver 700 includes isolation circuits 730 and 770, and a balanced latch 750. Isolation circuit 730 has an input connected to a node 731, and an output connected to node INA 531. Isolation circuit 770 has an input connected to a node 771, and terminal INB. Balanced latch 750 has control input terminals for receiving a signals labeled "READ LATCH", "READ LATCHB", "PROGRAM LATCH", "PROGRAM LATCHB", data input terminals connected to nodes 731 and 771, and an output terminal for providing signal DATA OUT 534.

Forcing circuit 740 has an input terminal for receiving a signal labeled "DATAL", and an output terminal connected node 731. Forcing circuit 780 has an input terminal for receiving a signal labeled "DATAR", and as output terminal connected node 771. Program driver 710 has a voltage reference input terminal for receiving a charge-pumped reference voltage labeled "VPGM", a first input terminal labelled "IN1" connected to node 731, a second input terminal labelled "IN2" connected to node 771, a first output terminal labelled "OUT1" for providing a first output signal labelled "VOUTL", and a second output terminal labelled "OUT2" for providing a signals labelled "VOUTR".

In operation, programming driver 700 includes common elements with sense amp 500 of FIG. 5, which saves circuit area. As shown in FIG. 7, voltage comparator 530 is also used during the program mode and includes a balanced latch 750 and two isolation circuits, 730 and 770. Balanced latch 750 receives the data to be driven to a selected bit line from forcing circuits 740 and 780. When in program mode, signals DATAL and DATAR are both driven, but in a complementary fashion. Which one of signals DATAL and DATAR is true and which one is complementary depends on which array half is selected. This state is stored in the latch when signals labeled "PGM LATCH" and "PGM LATCHB" activated. The latched data is received by program driver 710 which presents the appropriate voltage level to the bit line decoder where the selected bit line is located. Likewise, when right bit cell array 480 is selected during a write mode, forcing circuit 780 drives the appropriate state to the latch 740, and the program driver 710 provides the appropriate signal to bit line decoder 760.

Program driver 710 is adapted to receive the signals on nodes 731 and 771 at inputs IN1 and IN2, respectively, and to provide output voltages labeled OUT1 an OUT2, respectively. The voltages at OUT1 and OUT2 are at higher voltage levels than the received voltages. The higher voltage levels are determined by an input voltage signal VPGM which is approximately five volts. Because of the operation of program driver 710, voltage comparator 530 requires isolation circuits 730 and 770 to prevent the higher voltages of signals OUT1 and OUT2 from damaging the circuitry of balanced latch 750. Also, during a program cycle, the current demands of selected memory cells affect the voltage of VPGM significantly, therefore, it is important to power balanced latch 750 from a stable $V_{DD}$ supply which is separate from VPGM. The reuse of voltage comparator 530 allows a reduction in circuit area and allows the program driving function to be accomplished within a relatively small pitch, namely the pitch of 8 bit lines associated with the sense amplifier.

Figure 8A:
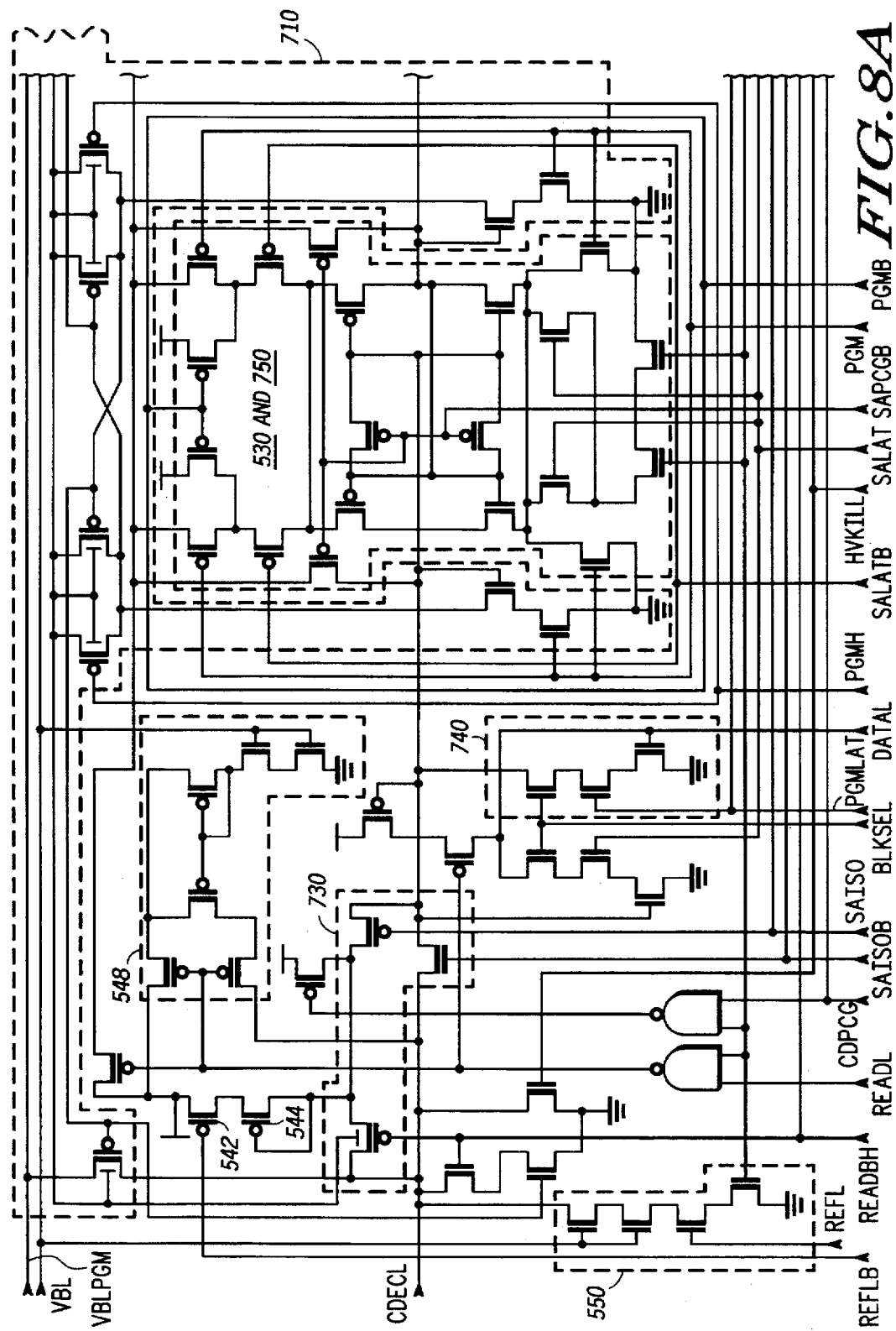
FIGS. 8A–8B illustrates in partial logic diagram and partial schematic form specific circuitry which may be used to implement portions of the circuitry illustrated with reference to FIGS. 5 and 7.
Figure 8B:
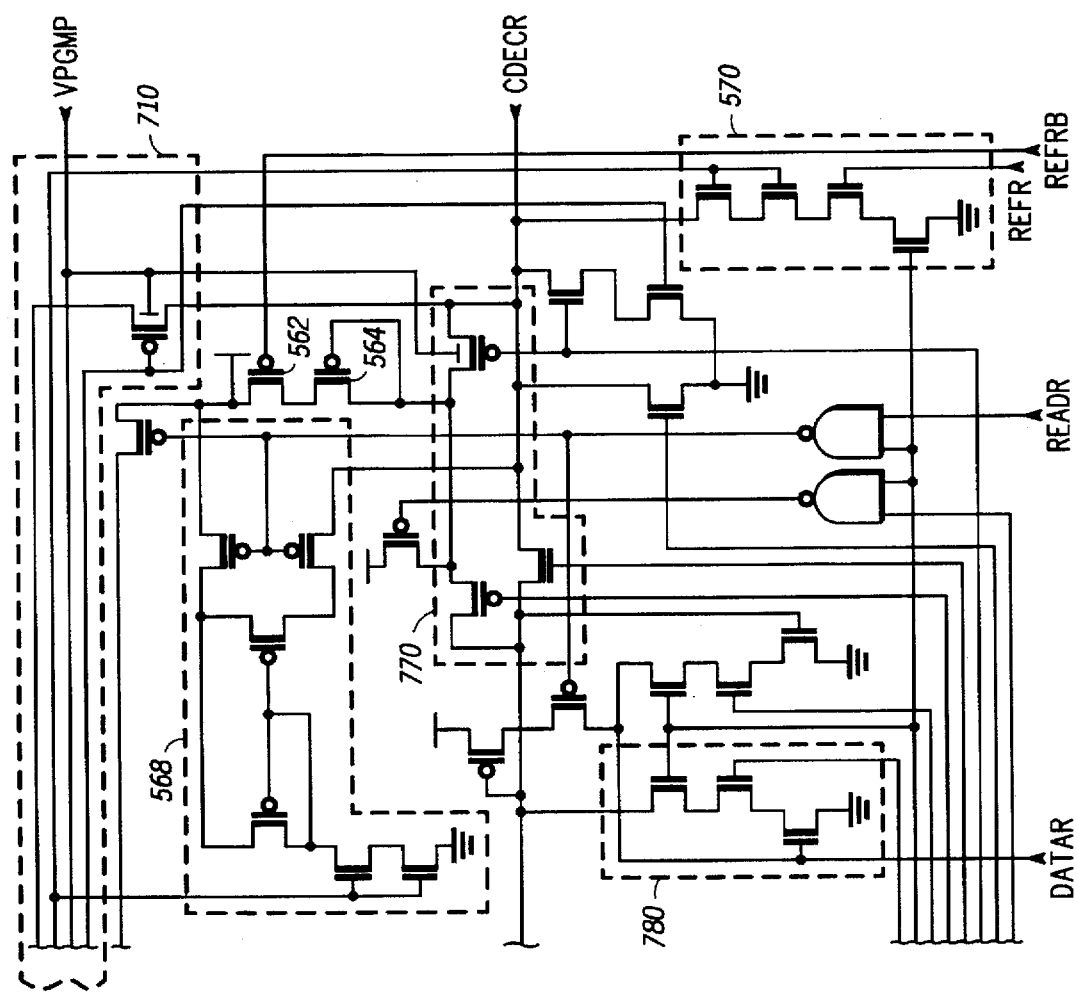

FIG. 8 illustrates in partial logic diagram and partial schematic form specific circuitry which may be used to implement portions of sense amp 500 of FIG. 5 and programming driver 700 of FIG. 7. Because the circuitry in FIG. 8 is a specific example of these circuits, there is not necessarily a one-to-one correspondence between the signals of FIG. 8 and those of FIG. 5. For instance, signal COMPARE ENABLE 582 of FIG. 5 is implemented using complementary signals SALATB and SALAT of FIG. 8. Signal DATA OUT 534 is implemented with complementary signals DATAL and DATAR of FIG. 8 which form part of a bus. Signals CDECL and CDECR of FIG. 8 are node INA 531 and node INB 532, respectively, of FIG. 5. Other elements which correspond to elements in FIGS. 5 and 7 are identified with the same reference numbers.

Figure 9:
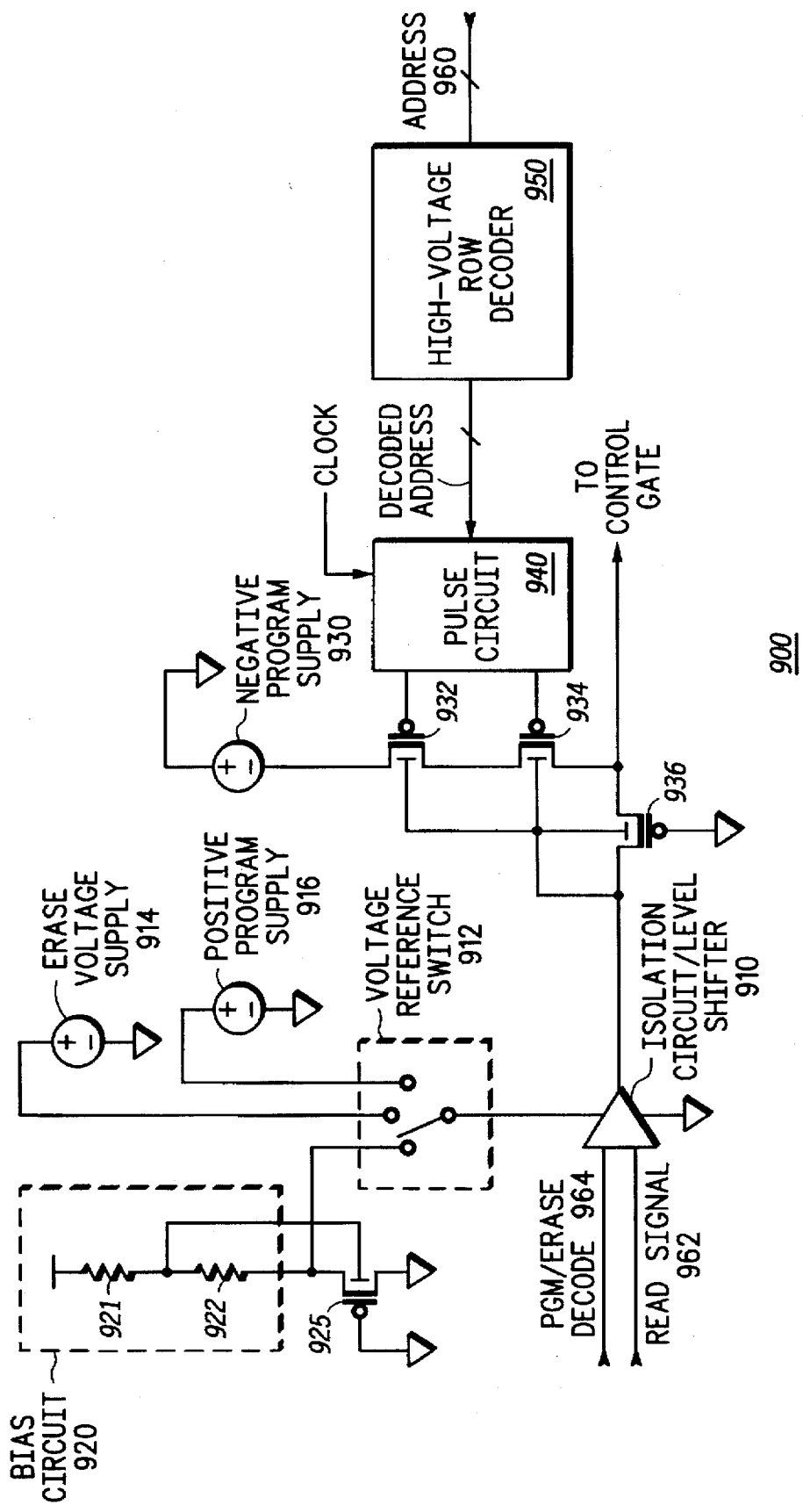
FIG. 9 illustrates in partial block diagram, partial logic diagram, and partial schematic form a control gate driver circuit in accordance with the present invention.

FIG. 9 illustrates, in partial block diagram, partial logic diagram, and partial schematic form a control gate driver circuit 900 in accordance with the present invention. Control gate driver circuit 900 represents a portion of high voltage word decode portion 430 of FIG. 4. Control gate driver circuit 900 includes an isolation circuit/level shifter 910, a voltage reference switch 912, P-type MOS transistors 925, 932, 934, and 936, a bias circuit 920, an erase voltage supply 914, a positive program voltage supply 916, a negative program voltage supply 930, a pulse circuit 940, and a high voltage row decoder 950.

Isolation circuit/level shifter 910 has a first input terminal for receiving a signal labeled "PROGRAM/ERASE DECODE" 964, a second input terminal for receiving a signal labelled "READ SIGNAL" 962, a first voltage reference terminal, a second voltage reference terminal connected to a ground potential, and an output terminal. Voltage reference switch 912 has a first input voltage reference terminal, a second input voltage reference terminal, and a third input voltage reference terminal, and an output terminal connected to provide a voltage reference output to the first voltage reference terminal of isolation circuit 910.

Transistor 925 has a gate connected to a ground potential, a drain connected to a ground potential, a source connected to the first input voltage reference terminal of voltage reference switch 912, and a bulk terminal. Bias circuit 920 has a first terminal connected to the source of transistor 925, and a second terminal connected to the bulk terminal of transistor 925. Bias circuit 920 includes resistors 921 and 922. Resistor 921 has a first terminal connected to $V_{DD}$, and a second terminal connected to the bulk electrode of transistor 925. Resistor 922 has a first terminal connected to the second terminal of resistor 921, and a second terminal connected to the source of transistor 925.

Erase voltage supply 914 has a first terminal connected to a ground reference potential, and a second terminal connected to the second voltage reference input of voltage reference switch 912. Positive program voltage supply 916 has a first voltage terminal connected to a ground potential reference, and second voltage reference terminal connected to the third input voltage reference terminal of voltage reference switch 912. Transistor 936 has a gate connected to a ground reference potential, a first current electrode connected to the output terminal of the isolation circuit 912, a second current electrode connected to a control gate of transistors along a selected row, and a bulk electrode connected to the first current electrode. Transistor 934 has a gate, a first current electrode, a second current electrode connected to the second current electrode of transistor 936, and a bulk electrode connected to the first current electrode of transistor 936. Transistor 932 has a gate, a first current electrode, a second current electrode connected to the first current electrode of transistor 934, and a bulk electrode connected to the first current electrode of transistor 936. Negative programming voltage supply 930 has a first terminal connected to a ground voltage supply, and a second terminal connected to the first current electrode of transistor 932. Pulse circuit 940 has an input for receiving a signal labelled "DECODED ADDRESS", and has a first output terminal connected to the gate of transistor 932, and a second output terminal connected to the gate of transistor 934. High voltage row decoder 950 for receiving a signal labeled "ADDRESS 960", and an output for providing the DECODED ADDRESS to pulse circuit 940.

Note that as illustrated in FIG. 9, control gate driver circuit 900 includes portions of high voltage pre-decode block 432 and high voltage word decoder 430. However, in other embodiments the designation of these functions may be different. Therefore, it is important to recognize the function being performed in total by control gate driver circuit 900.

In operation, control gate driver circuit 900 drives a control gate as specified in FIG. 3, and as further described with reference to FIG. 4. During a read mode, voltage reference switch 912 is set to the first position to allow electrical connection to the source of transistor 925. Also during the read mode, READ SIGNAL 962 is active causing isolation circuit/level shifter 910 to provide a voltage at its output terminal equal to the voltage on the first voltage reference terminal. This voltage is equal to the P-channel threshold voltage of transistor 925 plus a small additional amount. The small additional amount is determined by the relative sizes of resistors 921 and 922 and the characteristics of transistor 925. Bias circuit 920 uses the body effect of MOSFETs to cause the threshold of transistor 925 to increase slightly; thus the voltage at the source of diode-connected transistor 925 will be slightly higher that the voltage required at the source of transistor 936 to make it conductive. Because of the incremental difference in biasing between transistor 925 and transistor 936, transistor 936 becomes slightly conductive. This control to make transistor 936 slightly conductive is achieved by biasing the bulk of transistor 925 slightly above the source through bias circuit 920 and the matching between transistor 925 and 936. Preferably transistors 925 and 936 are given the same gate width and gate length sizes and are oriented in the same direction on the integrated circuit. In addition, the small additional voltage is preferably selected to guarantee that transistor 936 becomes conductive for all expected processing variations.

During an erase mode, voltage reference switch 912 is set to the second position to electrically connect erase supply voltage 914 and the first voltage reference terminal of isolation circuit/level shifter 910. Since READ SIGNAL 962 is inactive during an erase mode, whether isolation circuit level shifter 910 provides +15 volts to the control gate is determined by PGM/ERASE DECODE SIGNAL 964. PGM/ERASE DECODE SIGNAL 964 represents a logical combination of both a program/erase signal and a pre-decoded signal which is received from low voltage word decode block 420 or 460. During the erase mode if PGM/ERASE DECODE SIGNAL 964 is active, control gate driver 900 drives the corresponding control gate to the +15 volt level generated by erase voltage supply 914.

During a program mode, voltage reference switch 912 is set to the third position to electrically connect positive program supply voltage 916 and the first voltage reference terminal of isolation circuit/level shifter 910. Unlike erase mode, signal PGR/ERASE DECODE 964 is active during program mode when the corresponding control gate is not located on a selected row. When driving an unselected row, isolation circuit/level shifter 910 drives a voltage equal to 3.5 volts which is provided by positive program supply 916. The 3.5 volt signal applied to the first current electrode of transistor 936 causes transistor 936 to become conductive, thereby providing the voltage of 3.5 volts to the control gate of the cell not selected for programming.

When signal PGM/ERASE DECODE 964 is inactive, indicating the corresponding control gate is located on a selected row, isolation circuit/level shifter 910 drives $V_{SS}$ to the first current electrode of transistor 936, making transistor 936 nonconductive. At the same time, high-voltage row decoder 950 activates signal DECODED ADDRESS to pulse circuit 940. Pulse circuit 940 makes transistors 932 and 934 conductive, causing negative program voltage supply 930 to be connected to the control gate. Note that when selected in this fashion, transistor 936 acts as an isolation transistor to prevent the −12 volt provided by negative program supply 930 from reaching the output terminal of isolation circuit/level shifter 910.

By providing a 3.5 volt bias to cells not selected for programming, control gate driver circuit 900 accomplishes two objectives. First, it reduces the portion of the bit cell junction leakage current which is influenced by the electric field near the edge of the floating gate. This reduction in leakage current in turn reduces the current demand from the programming power supply. Control gate driver circuit 900 also uses the 3.5 volt bias on unselected control gates to moderate the electric field across the tunnel oxide of unselected cells on a bit line selected for programming. This reduces the rate at which bit line voltages may disturb the data state stored on unselected cells of the bit line being programmed.

Negative program voltage supply 930, positive program supply 916, and erase voltage 914 are common to both left half bit cell array 440 and right bit cell array 480. Within high voltage word decode block 430 are four transistors of which transistor 932 is representative. Furthermore, corresponding to each word line is a transistor corresponding to transistor 934.

Instead of providing continuous active signals to a selected word line during the program mode, pulse circuit 940 provides a stream of pulses to select transistors 932 and 934 to gradually develop a program voltage of −12 volts on the selected word line. Because the circuitry to connect negative program supply 930 is not in the critical speed path of the read mode, there is no need to maximize the speed which allows pulse circuit 940 to gradually develop the −12 volts needed. In addition, transistors 932 and 934 may be made smaller. In the illustrated embodiment, transistor 934 is small enough to fit within the pitch of the memory cell. Furthermore, this pulsing action allows the capacitors in the charge pump which generates or which functions as negative program voltage supply 930 to be made smaller as well.

Figure 10:
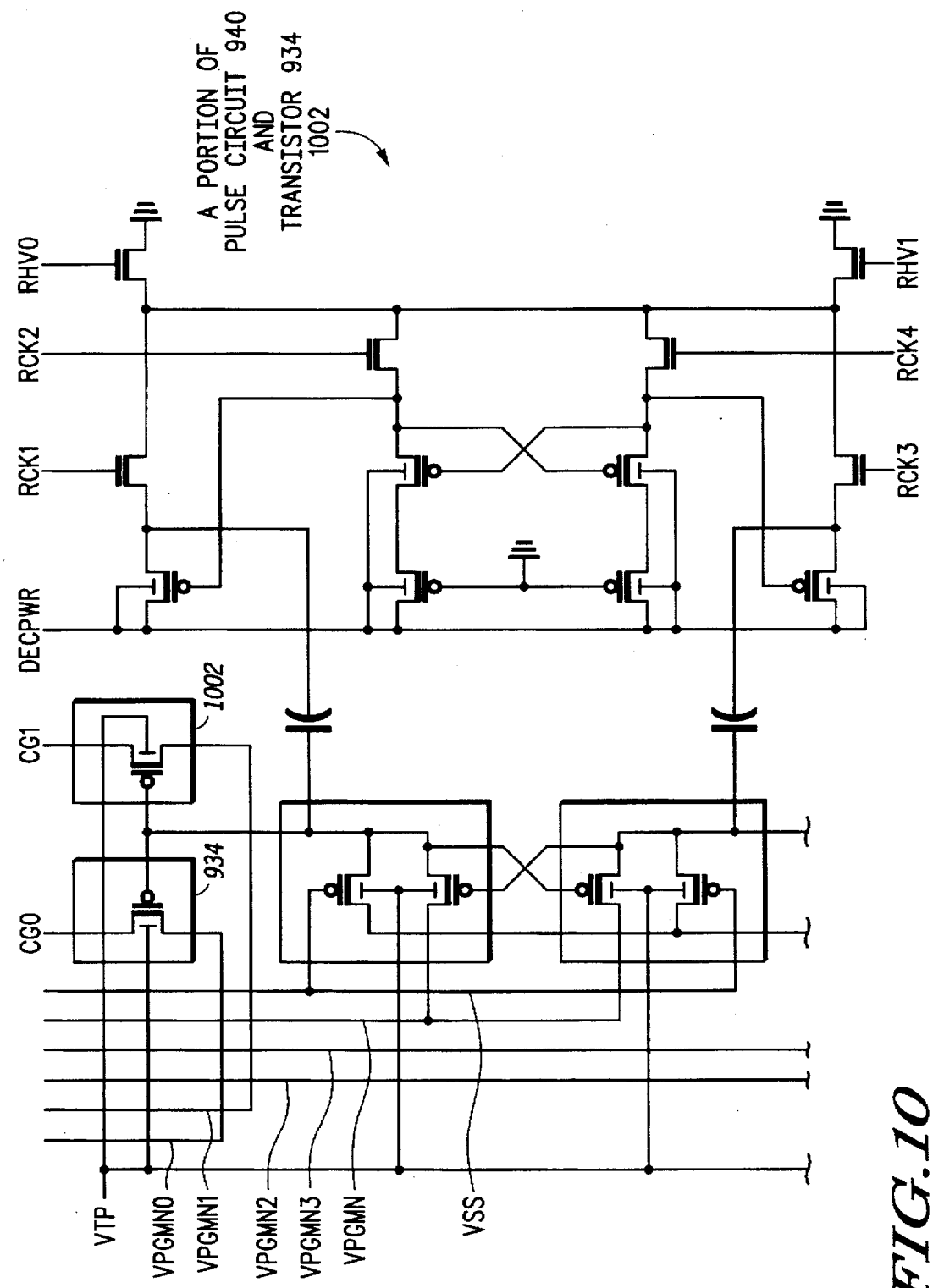
FIG. 10 illustrates in schematic form specific circuitry which may be used to implement a portion of the pulse circuit of FIG. 9.

FIG. 10 illustrates in schematic form specific circuitry which may be used to implement a portion of pulse circuit 940 of FIG. 9. Note that this circuitry is only exemplary and other circuitry may be used. FIG. 10 also illustrates transistor 934 and a P-channel transistor 1002. Transistor 1002 is similar to transistor 934, but drives a control gates on a different word line than does transistor 934. Transistor 934 provides a control gate drive signal labelled "CG0", whereas transistor 1002 provides a different control gate signal labeled "CG1". Being a specific implementation of the invention, there is not necessarily a one to one correspondence between the signals of FIG. 10 and those of FIG. 9.

Figure 11:
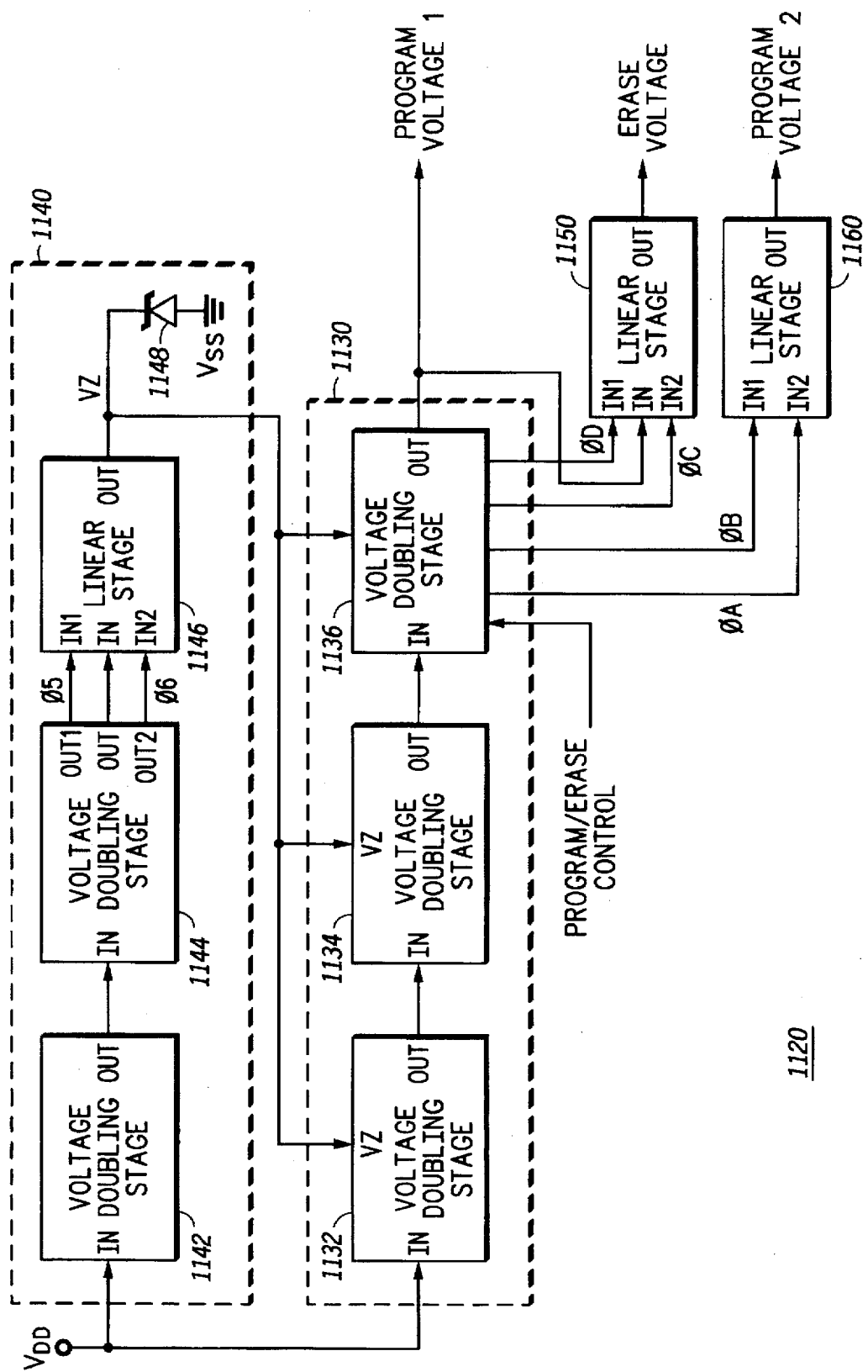
FIG. 11 illustrates in partial block diagram and partial schematic form, a charge pump used to generate the supply voltages for the control gate driver circuit of FIG. 9 in accordance with the present invention.

FIG. 11 illustrates in partial block diagram and partial schematic form a charge pump 1120 used to generate the supply voltages for control gate driver circuit 900 of FIG. 9 in accordance with the present invention. Charge pump 1120 includes a non-linear stage 1130, a reference voltage generating stage 1140, and linear stages 1150 and 1160. The voltage reference generating circuit 1140 is connected to a first voltage reference terminal ($V_{DD}$), and produces a reference voltage labeled "Vz". $V_{DD}$ is a more positive power supply voltage terminal having a nominal value of 2.7 volts but which may have a much lower value. The stage 1130 is connected to $V_{DD}$, receives reference voltage Vz and a signal labeled "PROGRAM/ERASE CONTROL", and produces signals labeled "PROGRAM VOLTAGE 1", and signals labelled "φA", "φB", "φC", and "φD". The linear stage 1150 receives the signals φC, φD and PROGRAM VOLTAGE 1 and generates the an output signal labeled "ERASE VOLTAGE". The linear stage 1160 receives the signals φA and φB and generates a signal labeled "PROGRAM VOLTAGE 2". As specified in FIG. 3, the PROGRAM VOLTAGE 1 is approximately five volts, while PROGRAM VOLTAGE 2 is approximately −12 volts and thus they are suitable to be used to program the EEPROM cell of FIG. 1. The ERASE VOLTAGE is also set to approximately 15.5 volts.

Non-linear stage 1130 includes: a regulated voltage doubling stage 1132 having an input connected to $V_{DD}$, an input labeled "Vz" for receiving a voltage reference signal, and an output for producing an output voltage approximately double the voltage received at the input; a voltage doubling stage 1134 having an input connected to the output of stage 1132, an input labeled "Vz" for receiving a voltage reference signal, and an output for producing an output voltage approximately double the voltage received at the input; a voltage doubling stage 1136 having an input connected to the output of stage 1134, an input labeled "Vz" for receiving a voltage reference signal, an output for producing signal PROGRAM VOLTAGE 1, and the phase signals φA, φB, φC, φD.

Preferably the voltage Vz is chosen to limit any stage from producing an output of more than five volts as required by the PROGRAM VOLTAGE 1. In the present embodiment of the invention, each stage receives the same voltage reference, as they all receive the same voltage Vz. In a different embodiment, different reference voltages could be used for each stage. The regulated voltage doubling stage 1136 generates a series of driving signals having a voltage amplitude approximately equal to the PROGRAM VOLTAGE 1. These driving signals are used to provide timing and power to the linear stages 1150 and 1160.

The voltage reference generating circuit 1140 includes regulated voltage doubling stage 1142 connected to the regulated voltage doubling stage 1144. The stage 1144 is connected to the linear stage 1146. Stage 1146 is connected to a current shunting regulating diode 1148, which is connected to a power supply voltage terminal labeled "$V_{SS}$". $V_{SS}$ generally has a nominal value of 0 volts which is a lower potential than $V_{DD}$. The regulated voltage doubling stages 1142 an 1144 are used in a non regulated fashion. As such, the stage 1142 will double the voltage provided at its input, as will stage 1144. Likewise, linear stage 1146 is also unregulated. However, it would be understood by one skilled in the art that any one of the stages 1142, 1144, and 1146 may need to have a secondary regulation in order to prevent breakdown of transistors inherent to it. It is understood that stages 1142, 1144, and 1146 may be various combinations of linear and voltage doubling stages depending on current and area constraints of a given application. For purposes of charge pump 1120, it is necessary for stages 1142, 1144, and 1146 to generate a voltage $V_z$ sufficient to bias the diode 1148 such that it breaks down, thereby producing the reference voltage $V_z$.

Linear stages 1150 and 1160 are used to generate an ERASE VOLTAGE and a PROGRAM VOLTAGE 2 respectively. Stages 1150 and 1160 are Dickson type linear charge pumps well known in the art.

Figure 12:
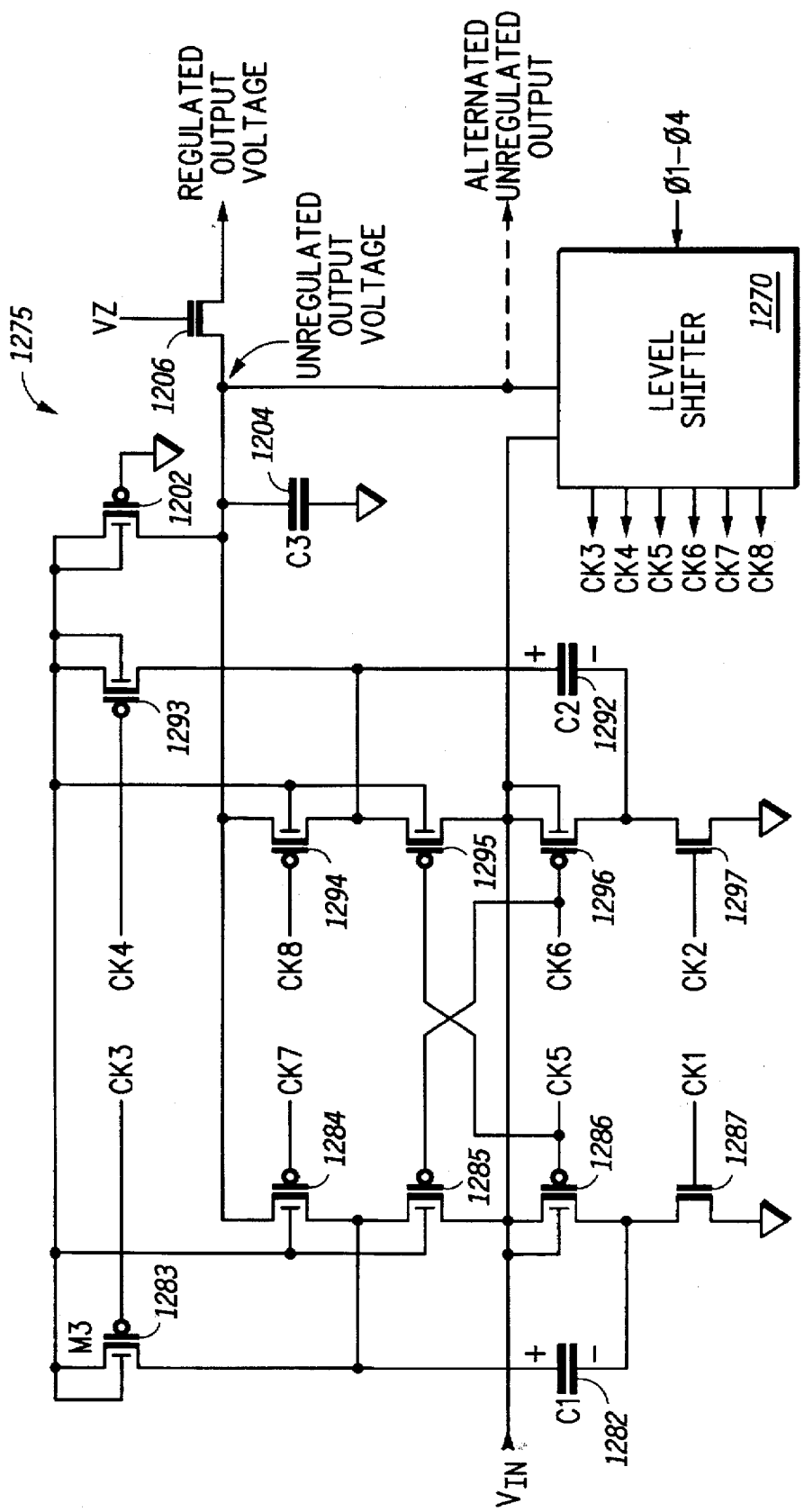
FIG. 12 illustrates in partial block diagram and partial schematic form one of the voltage doubling stages of FIG. 11.

FIG. 12 illustrates in partial block diagram and partial schematic form voltage doubling stage 1132. Note that voltage doubling stage 1132 may be used as one of the other voltage doubling stages of FIG. 11. Voltage doubling stage 1132 includes capacitors 1282 (C1), 1292 (C2) and 1204 (C3), P-type transistors 1283, 1284, 1285, 1286, 1293, 1294, 1295, 1296 and 1202, N-type transistors 1287, 1297, and 1206, and level shifter 1270. Capacitor C1 has a first electrode and a second electrode. P-type transistor 1283 has a control electrode for receiving a signal labeled "CK3", a first current electrode, a second current electrode connected to the first electrode of capacitor C1, and an N-type bulk terminal connected to its first current electrode. Transistor 1284 has a control electrode connected to receive a signal labeled CK7, a first current electrode, a second current electrode connected to the first electrode of capacitor C1, and an N-Type bulk terminal connected to the bulk terminal of transistor 1283. P-type transistor 1285 has a control electrode connected to receive a signal labeled CK6, a first current electrode connected to the second current electrode of transistor 1284, a second current electrode connected to receive an input voltage labeled "$V_{IN}$", and an N-bulk terminal connected to the N-bulk terminal of P-type transistor 1283. P-type transistor 1286 has a control electrode connected to receive a signal labeled CK5, a first current electrode connected to the second current electrode of transistor 1285, a second current electrode connected to the second electrode of C1, and an N-bulk terminal connected to receive input voltage $V_{IN}$. Transistor 1287 has a control electrode connected to receive a signal labeled CK1, a first current electrode connected to the second current electrode of transistor 1286, and a second current electrode connected to a first voltage reference terminal. Transistor 1294 has a control electrode connected to receive a signal labeled CK8, a first current electrode connected to the first current electrode of transistor 1284, a second current electrode, and an N-bulk terminal connected to the N-bulk terminal of P-type transistor 1283. P-type transistor 1295 has a control electrode connected to the control electrode of transistor 1286, a first current electrode connected to the second current electrode of transistor 1294, a second current electrode connected to receive $V_{IN}$, and an N-bulk terminal connected to the N-bulk terminal of transistor 1283. P-type transistor 1296 has a control electrode connected to the control electrode of transistor 1285, a first current electrode connected to the second current electrode of transistor 1295, a second current electrode, and an N-bulk terminal connected to receive $V_{IN}$. Transistor 1297 has a control electrode connected to receive a signal labeled CK2, a first current electrode connected to the second current electrode of transistor 1296, and a second current electrode connected to the first voltage reference terminal. C2 has a first electrode connected to the second current electrode of transistor 1294, and a second electrode connected to the second current electrode of transistor 1296. Transistor 1293 has a control node connected to receive a clock signal labeled CK4, a first current electrode connected to the first current electrode of transistor 1283, a second current electrode connected to the first electrode of C2, and an N-bulk terminal connected to the N-bulk terminal of transistor 1283.

Transistor 1202 has a control electrode connected to the first voltage reference terminal, a first current electrode connected to the first current electrode of transistor 1283, a second current electrode connected to the first current electrode of transistor 1294, and an N-bulk terminal connected to the N-bulk terminal of transistor 1283. Capacitor C3 has a first electrode connected to the second current electrode of transistor 1202 and providing a signal labelled "UNREGULATED OUTPUT VOLTAGE" thereon, and a second electrode connected to the first voltage reference terminal. Transistor 1206 has a control electrode connected to receive the voltage $V_z$, a first current electrode connected to the first electrode of C3, and a second current electrode for providing an output labelled "REGULATED OUTPUT VOLTAGE". Level shifter 1270 is connected to the first current electrode of transistor 1206, receives $V_{IN}$, φ1–φ4 and produces the signals CK3, CK4, CK5, CK6, CK7, and CK8.

In operation, the voltage reference circuit 1140 provides the reference voltage Vz to each of the voltage doubling stages 1132, 1134, and 1136 of the non-linear stage 1130. Since Vz only provides a voltage reference, only a minimal amount of charge needs to be provided by the circuit 1140. The non-linear stage 1130 provides the PROGRAM VOLTAGE 1, and therefore, provides the charge needed by an external load (not shown). By using non-linear stages, first stage capacitors having thinner dielectric layers can be formed on semiconductor devices because of the significantly lower voltages at these first stages. Thinner dielectrics allow for capacitors having higher capacitance, as will be described with reference to FIG. 14 below. This allows for a charge pump using less semiconductor area.

Figure 13:
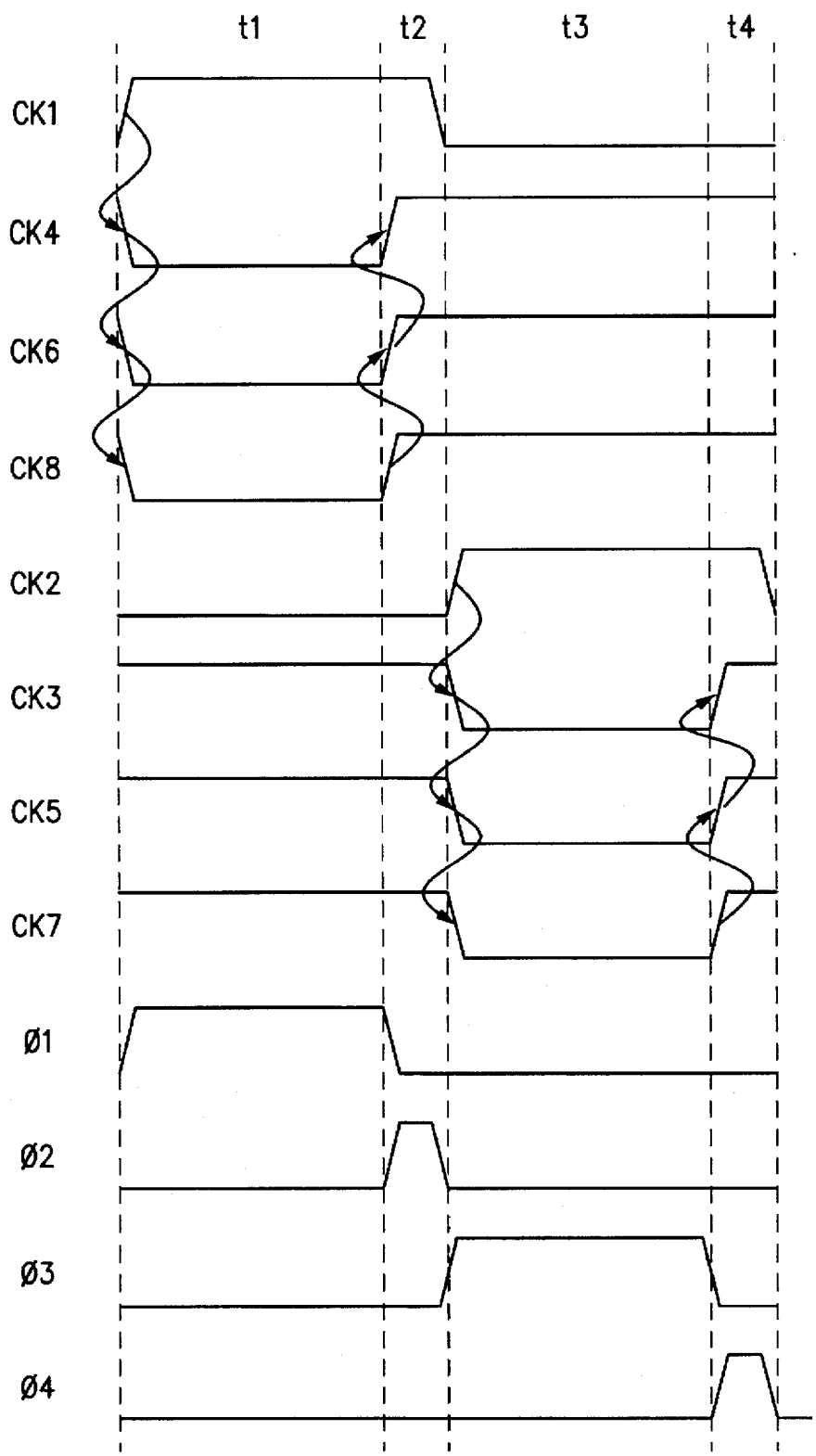
FIG. 13 illustrates a timing diagram of signals useful in understanding the operation of the voltage doubling stage of FIG. 12.

FIG. 13 illustrates a timing diagram of signals useful in understanding the operation of voltage doubling stage 1132 of FIG. 12. FIG. 12 illustrates the timing relationship of signals $\phi1$–$\phi4$ and CK1–CK8 which control the operation of regulated voltage doubling stage 1132 of FIG. 12. Now considering FIG. 13 in conjunction with FIG. 12, each clock signal is either active or inactive during a specific time, or portion, of the clock cycle. Portions of the clock cycle are referenced as t1, t2, t3, and t4. CK1 is active high during t1 and t2. CK4 is active low during t1. CK6 is active low during time t1. CK8 is active low during period t1. CK2 is active high during period t3 and t4, CK3 is active low during t3. CK5 is active low during t3. CK7 is active low during period t3. Note, the arrows of FIG. 13 indicate when an edge occurs at a substantially similar time during t2 or t4, but actually following another edge occurring at the same substantial time. For example, the rising edge of CK4 in time t2 occurs after the rising edge of CK6 during time t2. This, in effect, guarantees that the transistor controlled by CK6 has transitioned prior to the CK4 signal being termed inactive. CK1 and CK2 transition active low at the end of times t2 and t4 respectively. The timing of FIG. 13 allows the capacitors 1282 and 1292 to be alternately charged by the input signal while providing the REGULATED OUTPUT VOLTAGE through transistor 1206.

During t1, once a steady state condition has been obtained, the capacitor C1 is charged, while capacitor C2 is being discharged. The charging of capacitor C1 is facilitated because transistors 1285 and 1287 are driven active, while transistors 1284, 1286 and 1283 are driven inactive. This connects capacitor C1 between $V_{IN}$ and the first voltage reference, while isolating the capacitor C1 from the remainder of the circuit 1132. As a result, charge flows into C1 until it is charged to the voltage $V_{IN}$, or the cycle ends. During t3, the capacitor C2 is charged in a similar manner to $V_{IN}$.

During t1, C2 is generating the doubled voltage necessary to produce the UNREGULATED OUTPUT VOLTAGE. This is facilitated by transistors 1293, 1296 and 1294 being driven active, while transistors 1297, 1295, 1284, 1286 are driven inactive. This connects C2 between the UNREGULATED OUTPUT VOLTAGE terminal and VIN, while isolating the capacitor C2 from the remainder of the circuit 1132. The voltage produced at the first electrode of transistor 1294, which represents the unregulated output voltage, is the addition of the voltage across C2 and $V_{IN}$. As discussed previously the voltage across C2 is approximately $V_{IN}$, and therefore produces a voltage twice, or doubled, $V_{IN}$. The unregulated output voltage is regulated by transistor 1206 which is biased by signal Vz which is essentially constant, to provide the REGULATED OUTPUT VOLTAGE. During t3, the capacitor C1 is connected between VIN and the output terminal in a similar manner.

During time t2, in order to prevent charge from being injected at the electrode common to transistors 1286 and 1287, it is necessary to hold transistor 1287 in an active state. This ensures that the electrode is held at ground, thereby ensuring that the drain-to-substrate junction represented by the electrode is not forward biased. For example, by ensuring transistors 1284, 1285 and 1286 have fully transitioned before turning transistor 1287 inactive, the possibility for forward bias of substrate junctions is avoided.

Likewise, while transistors 1294, 1295, and 1296 are transitioning during time t4, it is assured that transistor 1297 is held active to avoid the same affects on the node common to transistors 1296 and 1297.

Transistors 1283, 1284, 1285, 1293, 1294, 1295, and 1202 have a common N-bulk terminal. The N-bulk terminal in accordance with one embodiment of the invention is actually an N-well. This N-well is charged to the UNREGULATED OUTPUT VOLTAGE through transistors 1283 and 1293, which are active during times t3 and t1 respectively. The transistor 1202 is a weak transistor used to ensure that the N-well voltage does not rise significantly above the REGULATED OUTPUT VOLTAGE and remain there for long periods of time. For example, on start up, or when an output load is applied to the output of the charge pump, a situation may exist where the N-well gets charged to a voltage significantly above the UNREGULATED OUTPUT VOLTAGE. Such a voltage differential causes MOS transistors to become less conductive than otherwise. If sustained, such a condition would reduce the overall output of the pump. Therefor transistor 1202 ensures that any voltage differential is merely transient in nature. By driving the N-Bulk to the UNREGULATED OUTPUT VOLTAGE, and not letting it charge and discharge with every cycle, efficiency is gained since no charge is lost due to capacitive parasitics associated with the well.

During time t2 and t4, it is possible for there to be a period of time where CK4 has transitioned and CK1 has not transitioned. During this time, it is not possible for the REGULATED OUTPUT VOLTAGE to receive its voltage from the transistors C1 or C2, therefore, the capacitor C3 is needed in order to bridge the gap during this period of time, and supplies any charge required by level shifter 1270 during t2 and t4. Generally, the capacitor C3 will be much smaller that the capacitors C1 and C2, as the time represented by t2 is much smaller than t1. Likewise, C3 provides the needed voltage during time t4.

The level shifter 1270 receives the signals $\phi1$ through $\phi4$ as represented in FIG. 13. $\phi1$ represents an active signal during time t1. Signal $\phi2$ represents an active signal during time period t2. Signal $\phi3$ represents an active period during time t3. Signal $\phi4$ represents an active signal during time t4. These signals are combined to generate the appropriate active signals and inactive signals for CK1 through CK8. CK1 and CK2 have an inactive low voltage of zero or ground, and an active high voltage reference of $V_{DD}$. CK3 through CK8 have low signals whether active or inactive, equal to zero or ground, while the high state, whether active or inactive, is equal to the UNREGULATED OUTPUT VOLTAGE which appears at the first electrode of capacitor C3. In addition, the CK1 and CK2 are generated by combining signals $\phi1$ and $\phi2$ and signals $\phi3$ and $\phi4$ respectively. As such, the level shifter applies the appropriate voltage levels needed to drive the stages within the charge pump 1120 in FIG. 11.

Referring back to FIG. 11, stages 1142 and 1144 are implemented using the regulated voltage doubling stage circuit 1132 of FIG. 12. However, the block 1144 is shown to drive two signals, $\phi5$ and $\phi6$, to drive the Dickson type stage 1146. Because of the requirements of the Dickson stage 1146, the signals $\phi5$ and $\phi6$ must be substantially equal to the bias or output voltage of stage 1144. With this condition met, the Dickson stage 1146, which has three internal stages, can provide an output voltage as much as four times its input voltage, but in any case, is limited to the breakdown voltage of the diode 1148.

Stages 1132, 1134, and 1136, of the nonlinear stage 1130 use the regulated voltage doubling stage circuit 1132 of FIG.

12. In each of these cases, the regulating voltage $V_z$ limits the voltage generated by any stage to five volts. The final stage of the nonlinear stage 1130 provides the additional phase signals φA, φB, φC, and φD. These signals are generated from the circuit 1132 by using two N and P transistor pairs (not shown) connected between the REGULATED OUTPUT VOLTAGE node, and ground. The timing is controlled by the timing signals in FIG. 13. Which pair of the N and P transistors is selected is actually controlled by the PROGRAM/ERASE CONTROL signal. The selected N and P transistor pair will generate the complimentary output signal needed to allow the Dickson type charge pumps 1150 and 1160 to operate. It should be noted that the operation of stage 1150 and stage 1160 are mutually exclusive of each other in that only one stage will be driven at any given time.

In order to estimate the capacitor values for C1 and C2 for each of the regulated voltage doubling stages 1132, 1134, 1136, 1142, and 1148, the following equations can be used:

Equation 1: Q=Iout/Freq;

Equation 2: $V(n) = V_{DD} * (V_{out}/V_{DD}) ** (n/N)$;

Equation 3: Vc(n)=2 * V(n−1)−V(n);

Equation 4: C(n)=QE12 * ((2 ** (N−n))*(eff ** (n−1−N)))/Vc(n);

Equation 5: Ctotal(N)=sum of all C(n) from n=1 to N.
Where:

$V_{DD}$ is the supply voltage

N is the number of stages in the charge pump;

Iout is the desired output current;

Vout is the desired output voltage;

eff is the efficiency of the circuit;

Freq is the frequency the charge pump is switching at

Equation 1 indicates the amount of charge available at the charge pump output. Equation 2 indicates the voltage at the output of a given stage n, if stages are sized to produced uniform stage to stage voltage gain. Equation 3 is the change in voltage across the capacitors of a given stage and during a pump cycle, which includes the charge and discharge of a capacitor such as C1 or C2. Equation 4 is the total capacitance of a given stage and of a charge pump expressed in picofarads. The value C(n) is the sum of capacitance of C1 and C2. Generally, C1 and C2 will be substantially similar. For example, for a $V_{DD}$ of 1.8 volts, and a three stage charge pump, requiring an output current of 1 microamp, and a required output voltage of 4.5 volts, with a clock signal of 1 megahertz, and a circuit efficiency of 98%, a capacitor value for the first stage of 3.7 picofarads per microamp of an output current. Stage two would have a capacitor requirement of 1.3 picofarads per microamp of output current, while stage 3 would have a capacitor requirement of 0.5 picofarads per microamp of output current. This would be the capacitor values needed for the combined capacitance of C1 and C2.

Figure 14:
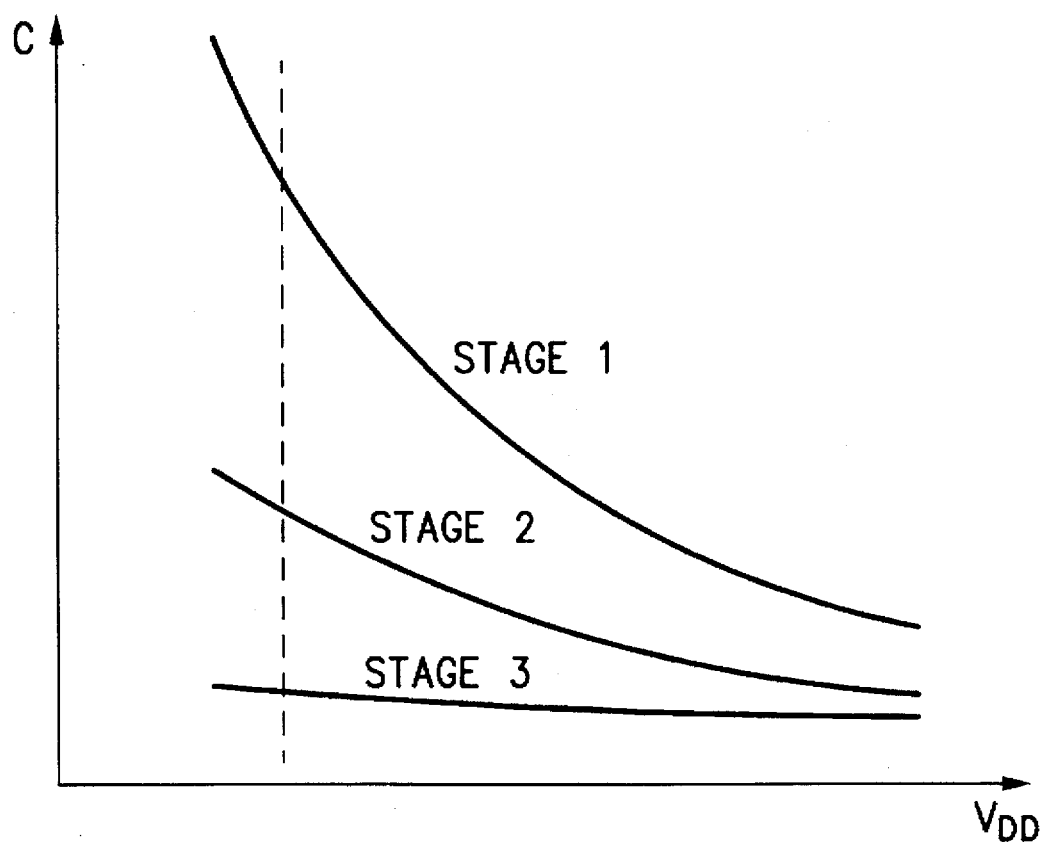
FIG. 14 illustrates, in graphical form, the capacitance associated with each stage of the charge pump of FIG. 11.

The selected capacitance values as described above shows the advantage of using a nonlinear charge pump of the present invention. The capacitor of stage 1 is significantly larger than the capacitors required in either stage 2 or stage 3 combined. This relationship is indicated in FIG. 14, which illustrates, in graphical form, the capacitance associated with each stage of charge pump 1120 of FIG. 11. The advantage is that the operating voltage of the first stage is significantly lower than that of the second and the third stages, thereby allowing a thinner dielectric layer to be used in the formation of capacitor C1. For example, in one embodiment of the invention, the dielectric layer of capacitor C1 can be the same thickness as the tunnel oxide dielectric used in the bit cell. This allows the formation of the capacitor using a much smaller surface area than one using a thick film dielectric as required in the stages C2 and C3 because of the larger voltages associated with them.

While the present invention has been described in the context of a preferred embodiment, it will be apparent to those skilled in the art that the present invention may be modified in numerous ways and may assume many embodiments other than that specifically set out and described above. For example, other voltage levels may be used to program the memory cell, or different numbers of control gates could be controlled with the control circuitry. Accordingly, it is intended by the appended claims to cover all modifications of the invention which fall within the true spirit and scope of the invention.

I claim:

1. A control gate driver circuit for providing a predetermined voltage to a control gate of an erasable programmable non-volatile memory cell during a read mode thereof, comprising:

a pass transistor of a predetermined conductivity type having a gate electrode coupled to a first voltage reference terminal, a first current electrode, a second current electrode coupled to the control gate, and a bulk electrode coupled to the first current electrode; and a bias circuit having an output terminal coupled to the first current electrode of the pass transistor, wherein the bias circuit generates the predetermined voltage on the output terminal, wherein the predetermined voltage is substantially equal to a threshold voltage of the pass transistor plus an incremental voltage.

2. The control gate driver circuit of claim 1, wherein the bias circuit further comprises:

a bias transistor of the predetermined conductivity type of the pass transistor having a gate electrode coupled to the first voltage reference terminal, a first current electrode coupled to the output terminal, a second current electrode coupled to the first voltage reference terminal, and a bulk electrode; and a bulk bias circuit having a first voltage terminal coupled to the first current electrode of the bias transistor, and a second voltage electrode coupled to the bulk electrode of the bias transistor, wherein the bulk bias circuit produces a higher voltage potential at the second voltage electrode than at the first voltage reference terminal.

3. The control gate driver circuit of claim 2, wherein the bias transistor is substantially similar to the pass transistor.

4. The control gate driver circuit of claim 2, wherein the bulk bias circuit comprises:

a first voltage drop device having a first terminal coupled to a second voltage reference terminal and a second terminal coupled to the bulk electrode; and a second voltage drop device having a first terminal coupled to the second terminal of the first voltage drop device, and a second terminal coupled to the first current electrode of the bias transistor.

5. The control gate driver circuit of claim 4, wherein the first voltage drop device and the second voltage drop device are resistors.

6. The control gate driver circuit of claim 4, wherein the predetermined voltage is greater than approximately 100 millivolts.

7. The control gate driver circuit of claim 1 further comprising:

an isolation circuit having an input terminal coupled to the output terminal of the bias circuit, an output terminal coupled to the first current electrode of the pass transistor, and a control electrode for receiving a control signal which enables the isolation circuit.

8. The control gate driver circuit of claim 1, wherein the predetermined conductivity type is a p-channel transistor.

9. A control gate driver circuit for providing a predetermined voltage to a control gate of an erasable programmable non-volatile memory cell during a program mode thereof, comprising:

a first program voltage source having a reference terminal for providing a first programming voltage;

a first pass transistor of a predetermined conductivity type having a control electrode, a first current electrode coupled to the reference terminal, and a second current electrode for driving the control gate;

a pulsing circuit having a pulsed output terminal coupled to the control electrode of the first pass transistor, and a data input, for receiving at least one data signal, wherein the pulsing circuit provides a pulsed representation of the at least one data signal at the pulsed output terminal; and a decoder having an address input for receiving an address signal, and a decoded output coupled to the data input of the pulsing circuit, wherein the decoder decodes the address input during the program mode.

10. The control gate driver circuit of claim 9, wherein the pulsing circuit further comprises a clock input for receiving a clock signal, wherein the pulsed representation of the at least one data signal is based on the clock signal.

11. The control gate driver circuit of claim 9, further comprising: a second pass transistor having a control electrode coupled to the pulsed output terminal, a first current electrode coupled to the second current electrode of the first pass transistor, and a second current electrode for driving the control gate.

12. The control gate driver circuit of claim 9, further comprising:

a second program voltage source having a reference terminal for providing a second programming voltage; and a second pass transistor of the predetermined conductivity type having a gate elect-rode coupled to a first voltage reference terminal, a first current electrode coupled to the reference terminal of the second program voltage source, and a second current electrode coupled to the control gate.

13. The control gate driver circuit of claim 12 wherein the first program voltage is a negative voltage, and the second program voltage is a non-negative voltage.

14. The control gate driver circuit of claim 12, further comprising:

an isolation circuit having an input terminal coupled to the reference terminal of the second program voltage source, an output electrode coupled to the first current electrode of the second pass transistor, and a control electrode for receiving a control signal which enables the isolation circuit during the program mode.

15. The control gate driver circuit of claim 14 wherein the first programming voltage is provided to the control circuit when the memory cell is selected for programming, and the second programming voltage is provided to the control gate when the memory cell is not selected for programming.

16. A control gate driver circuit having a control gate voltage terminal for providing a control gate voltage to the control gate of an erasable programmable non-volatile memory cell, the circuit comprising:

a read voltage terminal;

an erase voltage terminal;

a program select voltage terminal;

a program non-select voltage terminal;

a first decode portion for receiving an address and control signals, and coupled to the read voltage terminal, the erase voltage terminal, and the program non-select voltage terminal, and having a first voltage output, the first decode portion associated with a control gate of a memory cell, the first decode portion supports a plurality of modes based on the address and control signals, the modes comprising:

an erase mode, wherein the first decode portion couples the erase voltage terminal to the first voltage output when the memory cell is selected and the control signals indicate an erase mode;

a program select mode, wherein the first decode portion couples the read voltage terminal to the first voltage output when the memory cell is selected and the control signals indicate an erase mode;

a program non-select mode, wherein the first decode portion couples the program select voltage terminal to the first voltage output when the memory cell is not selected and the control signals indicate an erase mode;

a read mode, wherein the first decode portion couples the read voltage terminal to the first voltage terminal when the control signal indicate a read;

second decode portion for receiving an address and control signals, and coupled to the program select voltage terminal, and having an second voltage output, the second decode portion associated with the control gate of the memory cell, wherein the second decode portion provides the program select voltage to the second voltage output when the memory cell is selected and the control signals indicate a program mode; p1 a transistor of a predetermined type having a control electrode coupled to a first voltage reference, a first current electrode coupled to the first voltage output, a second current electrode coupled the second voltage output and providing the control gate voltage terminal, and a bulk electrode coupled to the second current electrode.

17. A control gate driver circuit for selectively driving a control gate of an erasable programmable nonvolatile memory cell, comprising:

a level shifter having a first power supply input terminal, a second power supply input terminal coupled to a first power supply voltage terminal, an enable input terminal for receiving a control signal, and an output terminal coupled to the control gate, wherein said level shifter provides a voltage of said first power supply input terminal to said output terminal thereof if said control signal is active;

a first reference voltage source having an output which provides a first reference voltage which biases the control gate in a read mode of operation;

a second reference voltage source having an output which provides a second reference voltage which biases the control gate in an erase mode of operation;

a third reference voltage source having an output which provides a third reference voltage which biases the control gate in a program mode of operation; and a selection circuit having a first input terminal coupled to said output terminal of said first reference voltage source, a second input terminal coupled to said output terminal of said second reference voltage source, a third input terminal coupled to said output terminal of said third reference voltage source, and an output terminal coupled to said first power supply input terminal of said level shifter.

18. The control gate driver circuit of claim 17 wherein said output terminal of said level shifter is coupled to the control gate through a transistor having a first current electrode coupled to said output terminal of said level shifter, a control electrode for receiving a fourth reference voltage, and a second current electrode coupled to the control gate.

19. The control gate driver circuit of claim 18 wherein said transistor is a P-channel metal-oxide-semiconductor (MOS) transistor.

20. The control gate driver circuit of claim 18 wherein said transistor further has a bulk electrode coupled to said first current electrode thereof.

21. The control gate driver circuit of claim 17 wherein said level shifter further has a second enable input terminal for receiving a decoded signal, and wherein said level shifter further provides said voltage of said first power supply input terminal to said out-put terminal thereof if said decoded signal is active while said control signal is inactive.

22. The control gate driver circuit of claim 21 wherein said control signal is active in said read mode, and wherein said decoded signal is selectively active in said erase mode and said program mode in dependence on whether an input address selects the erasable programmable nonvolatile memory cell.

23. A memory comprising:

an array of erasable programmable memory cells located at intersections of a plurality of rows and a plurality of columns, wherein each erasable programmable nonvolatile memory cell has a control gate and a select gate coupled to one of said plurality of rows, said array having a top and a bottom;

a first decoder below said bottom of said array and responsive to a row address for providing a plurality of first row select signals to said select gate of each erasable programmable nonvolatile memory cell in said array, wherein each first row select signal is coupled to said select gate of each erasable programmable nonvolatile memory cell along a corresponding row; and a second decoder above said top of said array and responsive to said row address for providing a plurality of second row select signals to said control gate of each erasable programmable nonvolatile memory cell in said array, wherein each second row select signal is coupled to said control gate of each erasable programmable nonvolatile memory cell along a corresponding row.

24. The memory of claim 23 wherein said second decoder is characterized as being a high voltage decoder.

25. The memory of claim 23 wherein:

said first decoder has an input terminal for receiving said row address, a first output terminal for providing said plurality of first row select signals, and a second output terminal for providing a plurality of predecoded signals;

said second decoder has an input terminal for receiving said plurality of predecoded signals, and an output terminal for providing said plurality of second row select signals; and said plurality of predecoded signals travel between said first decoder and said second decoder through said array.

* * * * *